(12) United States Patent
Kitano et al.

(10) Patent No.: US 6,536,964 B1
(45) Date of Patent: Mar. 25, 2003

(54) SUBSTRATE PROCESSING SYSTEM AND SUBSTRATE PROCESSING METHOD

(75) Inventors: Takahiro Kitano, Kikuyo-machi (JP); Masami Akimoto, Kikuyo-machi (JP); Takafumi Toshimitsu, Kikuyo-machi (JP)

(73) Assignee: Tokyo Electron Limited, Tokyo (JP)

( * ) Notice: Subject to any disclaimer, the term of this patent is extended or adjusted under 35 U.S.C. 154(b) by 240 days.

(21) Appl. No.: 09/652,141

(22) Filed: Aug. 31, 2000

(30) Foreign Application Priority Data

Sep. 3, 1999 (JP) .............................. 99-249769

(51) Int. Cl.$^7$ .......................... G03D 5/04; H01L 21/00; B05D 3/12; B05C 11/02
(52) U.S. Cl. .................. 396/611; 118/52; 118/666; 118/712; 427/240
(58) Field of Search .................. 396/611; 118/52, 118/666, 667, 715, 719, 720, 724, 712; 427/240, 347

(56) References Cited

U.S. PATENT DOCUMENTS 5,254,367 A    10/1993  Matsumura et al.
5,658,615 A  * 8/1997  Hasebe et al. .............. 427/240
5,695,817 A  * 12/1997 Tateyama et al. ........... 427/240
5,766,671 A  * 6/1998  Matsui ........................ 118/52

FOREIGN PATENT DOCUMENTS

JP   5-144721     6/1993
JP   2000-5687    1/2000

* cited by examiner

Primary Examiner—Alan A. Mathews
(74) Attorney, Agent, or Firm—Rader, Fishman & Grauer PLLC

(57) ABSTRACT

In an FAB having a plurality of coating and developing processing apparatus, atmospheric pressure is measured by a barometer provided in the FAB, and a measured value is sent to each of the coating and developing processing apparatus via a host computer. In each coating and developing processing apparatus, based on the value, the rotation speed of a substrate in a resist solution coating unit is regulated only when the atmospheric pressure value exceeds a predetermined allowable value which is preset according to the type of chemical. As a result, without causing the complication of the apparatus, plant and equipment investment can be held to minimum, and the coating film thickness of a substrate can be maintained at a predetermined thickness.

13 Claims, 21 Drawing Sheets

SUBSTRATE PROCESSING SYSTEM AND SUBSTRATE PROCESSING METHOD

BACKGROUND OF THE INVENTION

1. Field of the Invention

The present invention relates to a substrate processing system and a substrate processing method.

2. Description of the Related Art

In a photolithography process in the process of fabricating a semiconductor device, resist coating processing in which a resist film is formed on the front face of a semiconductor wafer (hereinafter referred to as "a wafer") and exposure processing are performed. A spin coating method in which the wafer is coated with a resist solution while being rotated is frequently used for this resist coating processing, and a rotary coating apparatus is used as a processing apparatus.

When resist coating processing is performed, it is necessary to maintain the temperature and humidity of an atmosphere in a coating apparatus constant for improving uniformity, reproducibility, and controllability of the thickness of a coating film.

The atmospheric pressure in a clean room where the coating apparatus is installed, however, slightly changes according to the season, arrival of low atmospheric pressure or high atmospheric pressure, or the condition of air-conditioning equipment. The thickness of a coating film formed on the front face of the wafer changes according to a change in the atmospheric pressure in the clean room even if the temperature and humidity of the atmosphere is maintained constant.

To solve such a problem, Japanese Patent Laid-open No. Hei 5-144721 discloses a photo-resist coating apparatus in which the atmospheric pressure in a coating cup in the coating apparatus is detected by an atmospheric pressure detecting section, the rotation speed of a motor is decided based on a detection signal by a data computing section, by an output therefrom, the wafer is rotated by the motor under the control of a motor rotation controlling section and coated with a coating solution, and which the thickness of the coating film is maintained constant by changing the rotation speed of the motor for rotating the wafer according to a change in the atmospheric pressure in a coating processing section.

The coating apparatus disclosed in Japanese Patent Laid-open No. Hei 5-144721, however, is a means for individually coping with a change in atmospheric pressure in each coating apparatus. In an actual clean room where photo-resist processing for a substrate is performed, a plurality of coating apparatus of various kinds are provided. Therefore, the application of the aforesaid apparatus to all the coating apparatus of different kinds causes complication and needs considerable plant and equipment investment, resulting in an increase in cost.

Also in exposure processing, the size of photo-resist pattern formed after exposure and developing has changed due to a change in the atmospheric pressure in the aligner even when the thickness of a resist film is the same.

SUMMARY OF THE INVENTION

An object of The present invention is to provide a substrate processing system or a substrate processing method capable of holding plant and equipment investment to minimum without causing complication of apparatus, and maintaining the thickness of a coating film at a predetermined thickness even when the atmospheric pressure changes in a clean room having a plurality of coating apparatus.

Another object of the present invention is to provide a substrate processing system or a substrate processing method capable of maintaining the size of a photo-resist pattern at a predetermined size even when the atmospheric pressure changes in the system including a coating apparatus and an aligner.

To attain these objects, in a first aspect of the present invention, a substrate processing system, comprising: a plurality of rotary coating apparatus, disposed in a room, each for coating a substrate with a chemical supplied from above the substrate while rotating the substrate; atmospheric pressure measuring means for measuring the atmospheric pressure in the room; and controlling means for controlling rotation speed at the time of coating in the rotary coating apparatus based on an atmospheric pressure value measured by the atmospheric pressure measuring means, is provided.

According to the aforesaid structure, the atmospheric pressure measuring means is provided in the room having the plurality of rotary coating apparatus, and the measured value of the atmospheric pressure in the room is used as a judgment standard for the control of rotation speed in each of the rotary coating apparatus, whereby it is unnecessary to provide a barometer in each of the rotary coating apparatus. Moreover, the rotation speed at the time of coating is controlled based on the measured value, and consequently the thickness of a coating film can be controlled, and thus the substrate can be coated with a chemical at a predetermined film thickness even when the atmospheric pressure changes.

In a second aspect of the present invention, a substrate processing system, comprising: a first rotary coating apparatus, disposed in a room, for coating a substrate with a first chemical supplied from above the substrate while rotating the substrate; a second rotary coating apparatus, disposed in the room, for coating the substrate with a second chemical supplied from above the substrate while rotating the substrate; atmospheric pressure measuring means for measuring the atmospheric pressure in the room; controlling means for controlling rotation speed at the time of coating in the first rotary coating apparatus based on an atmospheric pressure value measured by the atmospheric pressure measuring means; temperature and humidity measuring means for measuring the temperature and humidity in the second rotary coating apparatus; and controlling means for controlling rotation speed at the time of coating in the second rotary coating apparatus based on a temperature value and a humidity value measured by the temperature and humidity measuring means, is provided.

According to the aforesaid structure, it can be selected according to the type of resist whether the rotation speed is controlled or the temperature and humidity are controlled, whereby the thickness of a coating film can be controlled efficiently even if the types of resists are different.

In a third aspect of the present invention, a substrate processing method, comprising the steps of: measuring the atmospheric pressure in a room where a rotary coating apparatus for coating a substrate with a chemical supplied from above the substrate while rotating the substrate is disposed; and controlling rotation speed at the time of coating in the rotary coating apparatus based on an atmospheric pressure value measured in the measuring step, is provided.

According to the aforesaid structure, the thickness of a coating film can be controlled, and thus the substrate can be coated with the chemical at a predetermined film thickness even when the atmospheric pressure changes.

In a fourth aspect of the present invention, a substrate processing system, comprising: a rotary coating apparatus, disposed in a room, for coating a substrate with a chemical supplied from above the substrate while rotating the substrate; atmospheric pressure measuring means for measuring the atmospheric pressure in the room; mixing means for mixing a resist solution and a solvent to produce the chemical; and controlling means for controlling the mixing ratio of the resist solution to the solvent in the mixing means based on an atmospheric pressure value measured by the atmospheric pressure measuring means, is provided.

According to the aforesaid structure, the atmospheric pressure measuring means is provided in the room having a plurality of the rotary coating apparatus, and the measured value of the atmospheric pressure in the room is used as a judgment standard for the control of rotation speed in each of the rotary coating apparatus, whereby it is unnecessary to provide a barometer in each of the rotary coating apparatus. Moreover, the rotation speed at the time of coating is controlled based on the measured value, and consequently the thickness of a coating film can be controlled, and thus the substrate can be coated with the chemical at a predetermined film thickness even when the atmospheric pressure changes.

In a fifth aspect of the present invention, a substrate processing method, comprising the steps of: measuring the atmospheric pressure in a room where a rotary coating apparatus for coating a substrate with a chemical supplied from above the substrate while rotating the substrate is disposed; and controlling the mixing ratio of a resist solution to a solvent based on an atmospheric pressure value measured in said measuring step, is provided.

According to the aforesaid structure, the thickness of a coating film can be controlled, and thus the substrate can be coated with the chemical at a predetermined film thickness even when the atmospheric pressure changes.

In a sixth aspect of the present invention, a substrate processing system, comprising: a rotary coating apparatus for coating a substrate with a chemical supplied from above the substrate while rotating the substrate to form a coating film; an aligner for exposing the coating film; atmospheric pressure measuring means for measuring the atmospheric pressure in the aligner; and controlling means for controlling rotation speed at the time of coating in the rotary coating apparatus based on an atmospheric pressure value measured by the atmospheric pressure measuring means, is provided.

According to the aforesaid structure, the thickness of the coating film can be controlled in consideration of a change in the size of a photo-resist pattern due to a change in atmospheric pressure at the time of exposure. As a result, a photo-resist pattern with a stable size can be always obtained without being influenced by a change in atmospheric pressure. Furthermore, the rotary coating apparatus and the aligner may be disposed in the same room, and the atmospheric pressure measuring means may be provided in the room.

In a seventh aspect of the present invention, a substrate processing method, comprising the steps of: measuring the atmospheric pressure in an aligner for performing exposure processing for a substrate on which a coating film is formed; rotating the substrate while controlling rotation speed based on an atmospheric pressure value measured in said measuring step and coating the substrate with a chemical supplied from above the substrate to form the coating film; and subjecting the coating film to exposure processing in the aligner, is provided.

According to the aforesaid structure, the thickness of the coating film can be controlled in view of a change in the size of a photo-resist pattern due to a change in atmospheric pressure at the time of exposure. As a result, a photo-resist pattern with a stable size can be always obtained without being influenced by a change in atmospheric pressure.

In an eighth aspect of the present invention, a substrate processing system, comprising: a rotary coating apparatus for coating a substrate with a chemical supplied from above the substrate while rotating the substrate to form a coating film; an aligner for exposing the coating film; atmospheric pressure measuring means for measuring the atmospheric pressure in the aligner; mixing means for mixing a resist solution and a solvent to produce the chemical; and controlling means for controlling the mixing ratio of the resist solution to the solvent in the mixing means based on an atmospheric pressure value measured by the atmospheric pressure measuring means, is provided.

According to the aforesaid structure, the thickness of the coating film can be controlled in consideration of a change in the size of a photo-resist pattern due to a change in atmospheric pressure at the time of exposure. As a result, a photo-resist pattern with a stable size can be always obtained without being influenced by a change in atmospheric pressure. Furthermore, the rotary coating apparatus and the aligner may be disposed in the same room, and the atmospheric pressure measuring means may be provided in the room.

In a ninth aspect of the present invention, a substrate processing method, comprising the steps of: measuring the atmospheric pressure in an aligner for performing exposure processing for a substrate on which a coating film is formed; controlling the mixing ratio of a resist solution to a solvent based on an atmospheric pressure measured in said measuring step to produce a chemical; supplying the chemical onto the substrate and forming the coating film while rotating the substrate; and subjecting the coating film to exposure processing in the aligner, is provided.

According to the aforesaid structure, the thickness of the coating film can be controlled in view of a change in the size of a photo-resist pattern due to a change in atmospheric pressure at the time of exposure. As a result, a photo-resist pattern with a stable size can be always obtained without being influenced by a change in atmospheric pressure.

These objects and still other objects and advantages of the present invention will become apparent upon reading the following specification when taken in conjunction with the accompanying drawings.

DETAILED DESCRIPTION OF THE PREFERRED EMBODIMENT

A substrate processing system according to the present invention will be described below with reference to the accompanying drawings.

Figure 1:
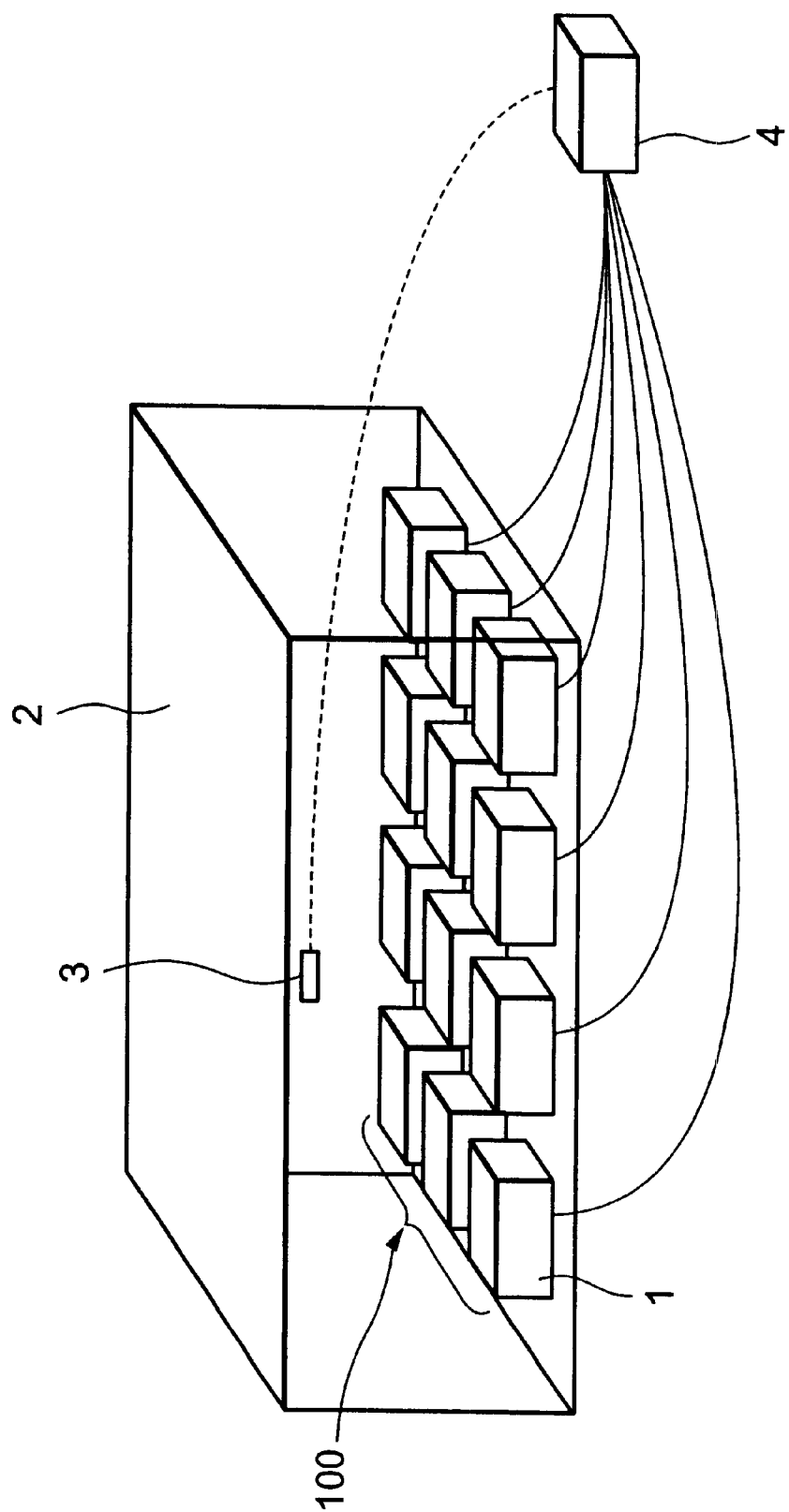
FIG. 1 is a schematic view of a substrate processing system according to a first embodiment.

As shown in FIG. 1, the substrate processing system according to the present invention is composed of a coating and developing processing apparatus 1 in which resist coating processing and developing processing in a lithography process for a wafer W are performed, an FAB 2 including a coating and developing processing unit group 100 composed of a plurality of coating and developing processing apparatus 1, a barometer 3 placed inside the FAB 2, and a host computer 4 connected to the barometer 3 and the coating and developing processing unit group 100.

In the FAB 2, an atmosphere is cleaned so that no dust adheres to the wafer. Also, the temperature and humidity are regulated and controlled so that the wafer W is always processed in a constant atmosphere.

The barometer 3 is attached in the FAB 2, for example, to the ceiling portion thereof, measures the atmospheric pressure in the FAB 2 at all times, and provides a measured value to the host computer 4.

The host computer 4 is installed in a control room not illustrated, connected to all of the coating and developing processing apparatus 1 in the FAB 2, and provides the atmospheric pressure value received from the barometer 3 to each of the coating and developing processing apparatus 1.

A plurality of coating and developing processing apparatus 1 are provided in the FAB 2 and have different structures depending on uses of wafers W to be processed. The coating and developing processing apparatus 1 performs resist coating processing for applying a resist film on the front face of the wafer W and developing processing for the wafer W which has undergone exposure processing in the lithography process. A structural example of one coating and developing processing apparatus 1 in the FAB 2 will be mentioned below.

Figure 2:
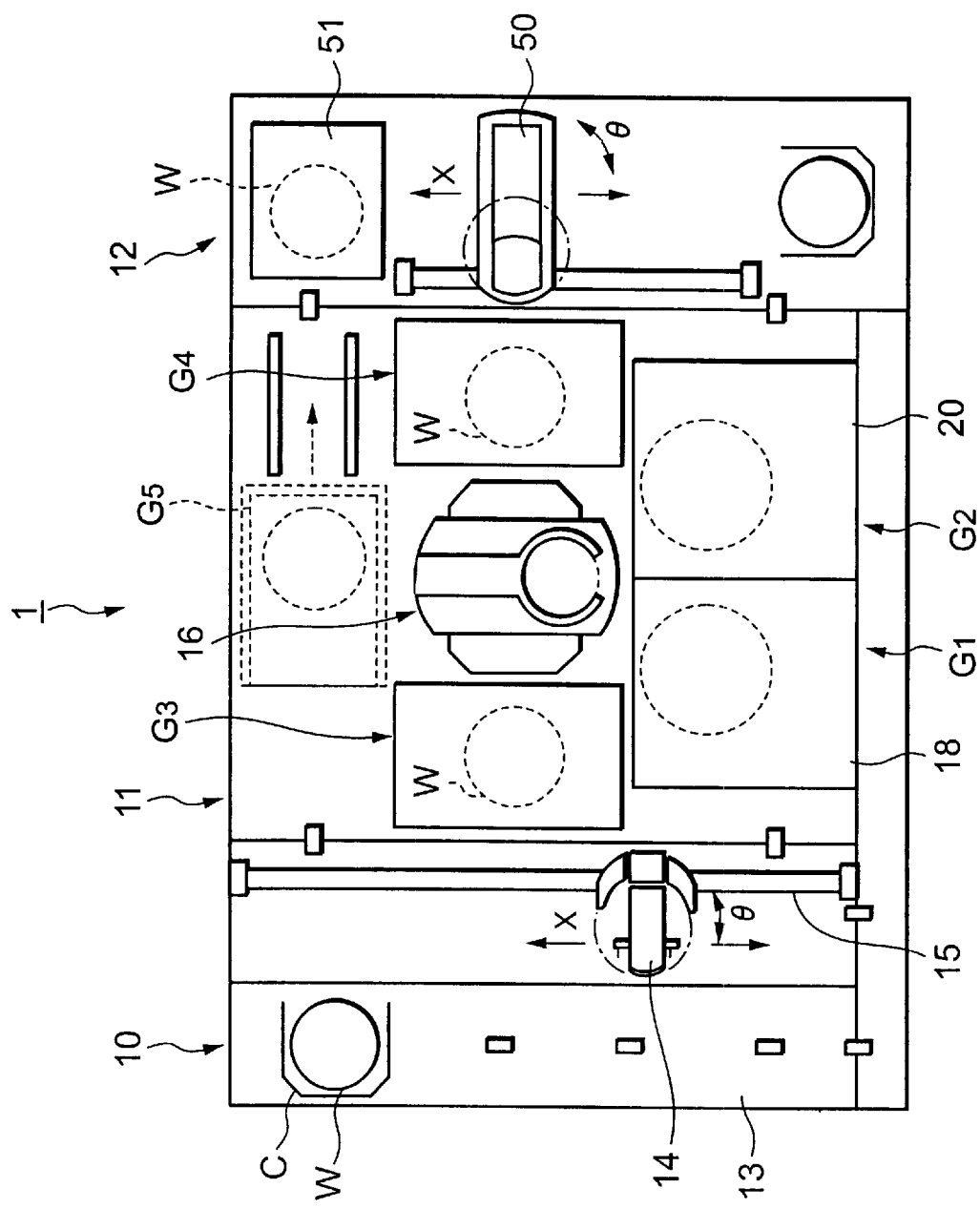
FIG. 2 is a plan view showing the entire structure of a coating and developing processing apparatus in the substrate processing system according to the first embodiment.
Figure 3:
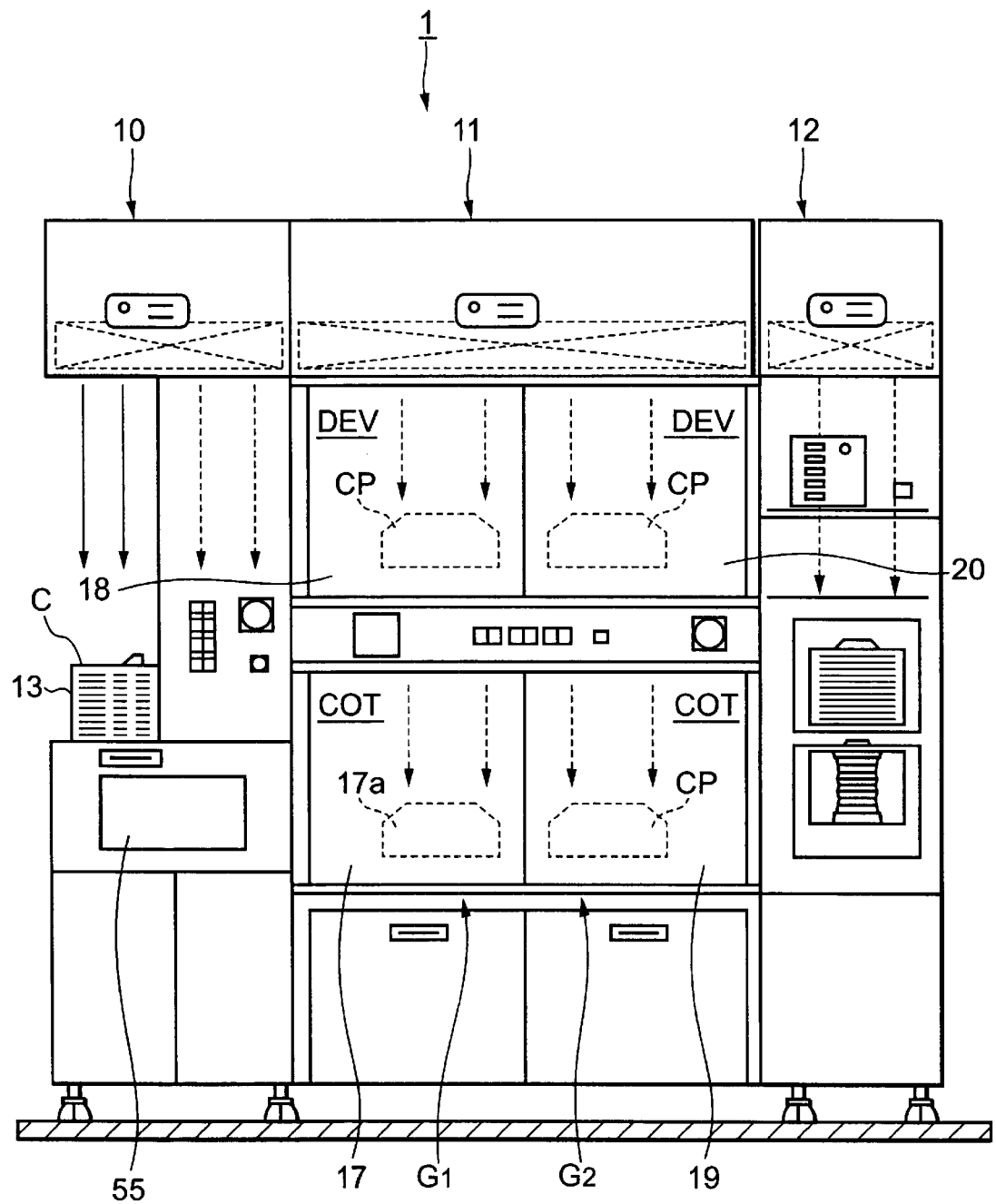
FIG. 3 is a front view showing the structure of the coating and developing processing apparatus in FIG. 2.
Figure 4:
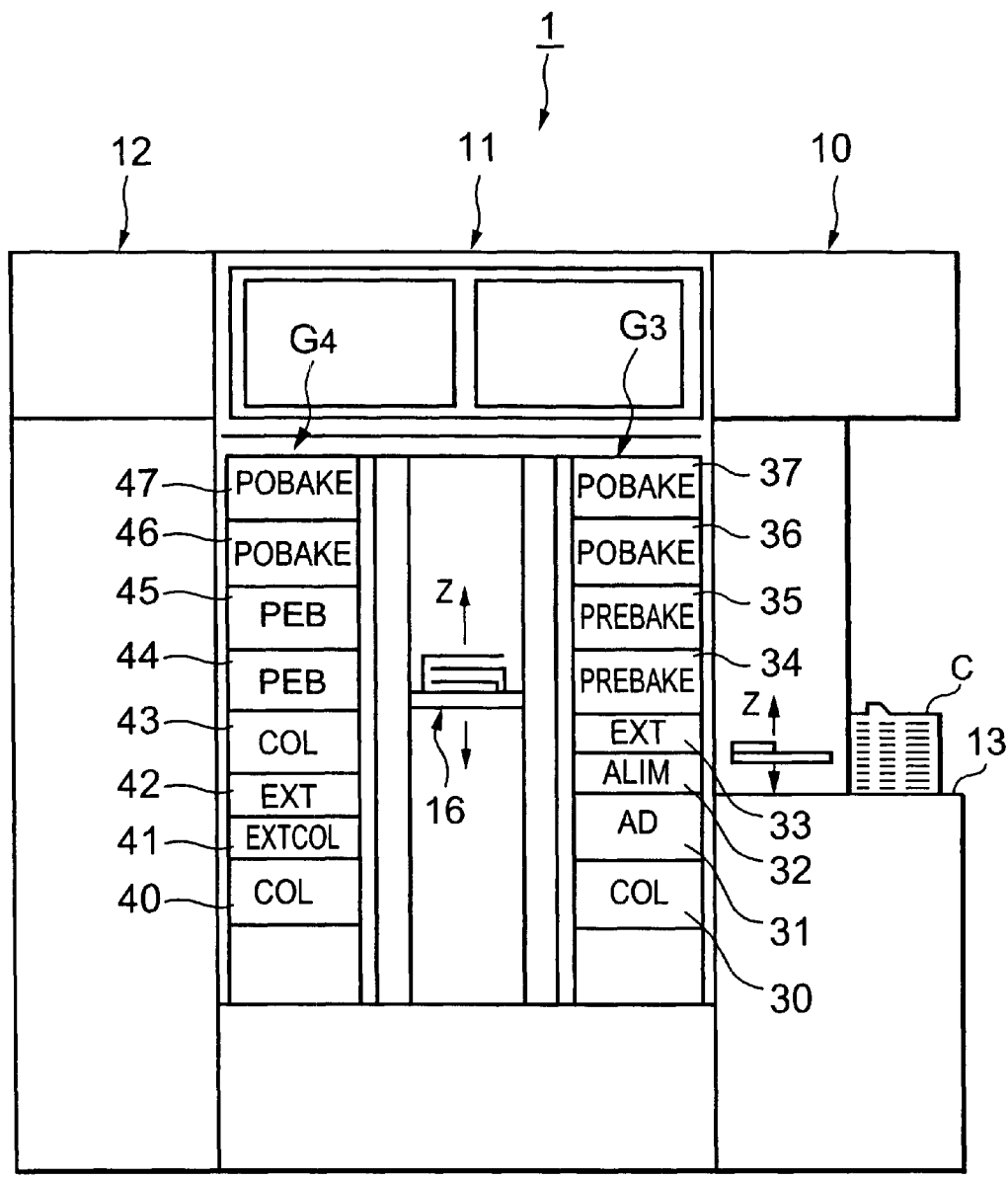
FIG. 4 is a rear view showing the structure of the coating and developing processing apparatus in FIG. 2.

FIG. 2 to FIG. 4 are entire structural views of the coating and developing processing apparatus 1, FIG. 2 is a plan view, FIG. 3 is a front view, and FIG. 4 is a rear view.

As shown in FIG. 2, the coating and developing processing apparatus 1 has structure in which a cassette station 10 for transferring, for example, 25 wafers W per cassette, as a unit, from/to the outside into/from the coating and developing processing apparatus 1 and carrying the wafer W into/out of a cassette C, a processing station 11 in which various kinds of processing units each for performing predetermined processing for the wafers W one by one are multi-tiered, and an interface section 12 for receiving and sending the wafer W from/to an aligner (not illustrated) provided adjacent to the processing station 11 are integrally connected.

In the cassette station 10, a plurality of cassettes C are freely mounted in a line in an X-direction (a vertical direction in FIG. 1) at predetermined positions on a cassette mounting table 13 being a mounting section. A wafer transfer body 14 movable in the direction of arrangement of the cassettes (the X-direction) and in the direction of arrangement of the wafers W housed in the cassette C (a Z-direction; vertical direction) is movable along a transfer path 15 to be able to selectively get access to each of the cassettes C. A main controller 55 for controlling respective units in the coating and developing processing apparatus 1 is provided at the lower portion of the cassette station 10.

The wafer transfer body 14 is also structured to be able to get access to an alignment unit 32 and an extension unit 33 which are included in a third processing unit group G3 on the processing station 11 side as will be described later.

In the processing station 11, a main transfer device 16 is provided in the middle thereof, and various kinds of processing units are multi-tiered to compose processing unit groups around the main transfer device 16. In the coating and developing processing apparatus 1, five processing unit groups G1, G2, G3, G4, and G5 can be arranged. The first and second processing unit groups G1 and G2 are arranged at the front of the coating and developing processing apparatus 1, the third processing unit group G3 is arranged adjacent to the cassette station 10, and the fourth processing unit group G4 is arranged adjacent to the interface section 12, and moreover the fifth processing unit group G5 shown by the broken line can be arranged at the back as an option.

As shown in FIG. 3, in the first processing unit group G1, two spinner-type processing units, for example, a resist coating unit 17 for applying a resist to the wafer W according to this embodiment to process the wafer W and a developing unit 18 for supplying a developing solution to the wafer W to process the wafer W are two-tiered from the bottom in order. Similarly, in the second processing unit group G2, a resist coating unit 19 and a developing processing unit 20 are two-tiered from the bottom in order.

As shown in FIG. 4, in the third processing unit group G3, oven-type processing units each for performing predetermined processing for the wafer W while the wafer W is placed on a mounting table, for example, a cooling unit 30 for performing cooling processing, an adhesion unit 31 for enhancing adhesion of a resist solution and the wafer W, an alignment unit 32 for aligning the wafer W, an extension unit 34 for making the wafer W wait, pre-baking units 34 and 35 for performing heat processing before exposure processing, and post-baking units 36 and 37 for performing heat processing after developing processing, or the like are eight-tiered from the bottom in order.

In the fourth processing unit group G4, for example, a cooling unit 40, an extension and cooling unit 41 for naturally cooling the mounted wafer W, an extension unit 42, a cooling unit 43, post-exposure baking units 44 and 45 for performing heat processing for the wafer W after exposure processing, and post-baking units 46 and 47, or the like are eight-tiered from the bottom in order.

A wafer transfer body 50 is provided in the middle of the interface section 12. The wafer transfer body 50 is structured to be able to get access to the extension and cooling unit 41 and the extension unit 42 included in the fourth processing unit group G4, a peripheral aligner 51, and the aligner (not illustrated).

Now, the resist coating unit 17 used in the substrate processing system according to this embodiment will be explained.

Figure 5:
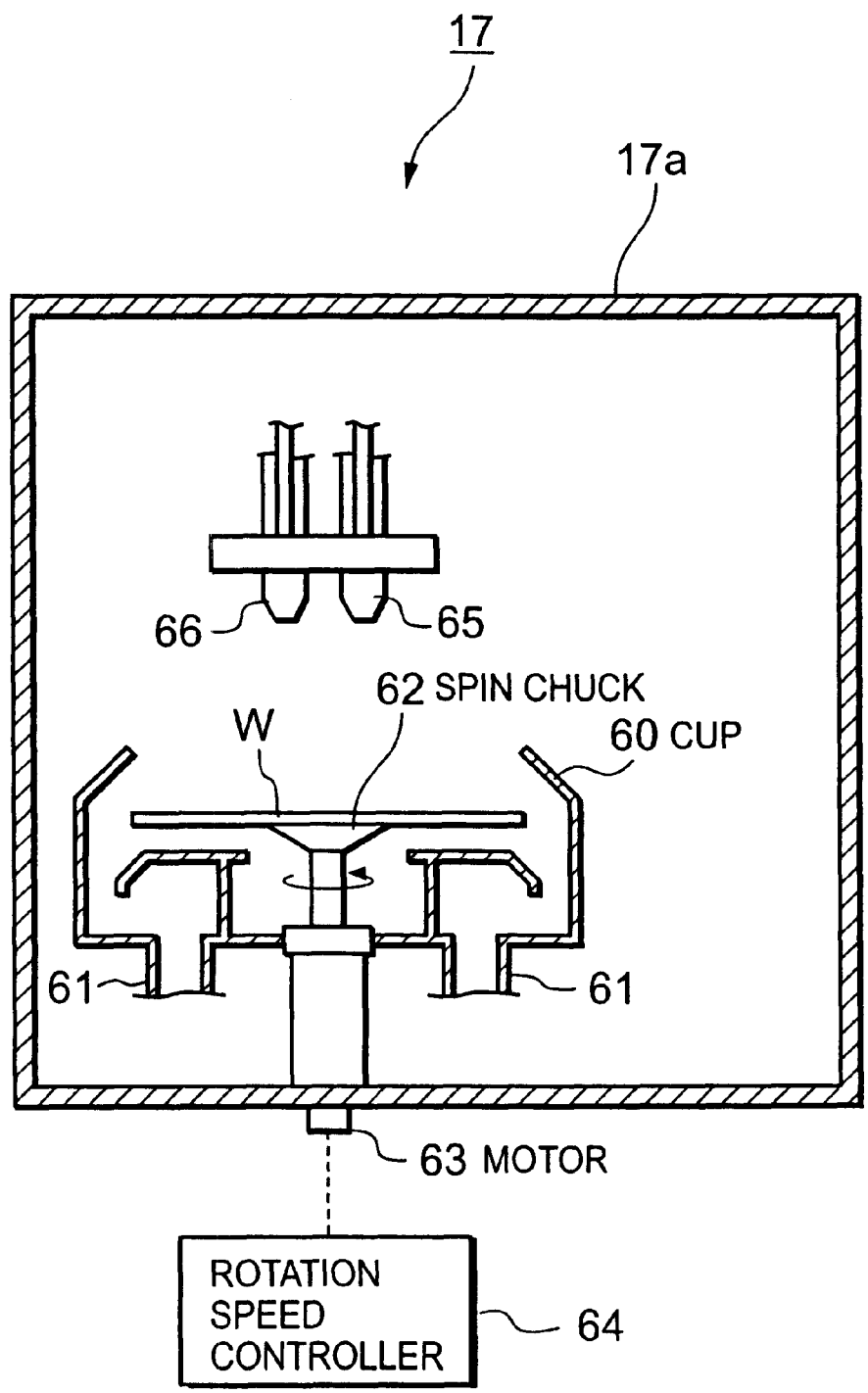
FIG. 5 is an explanatory view of a longitudinal section of a resist coating unit used in the first embodiment.
Figure 6:
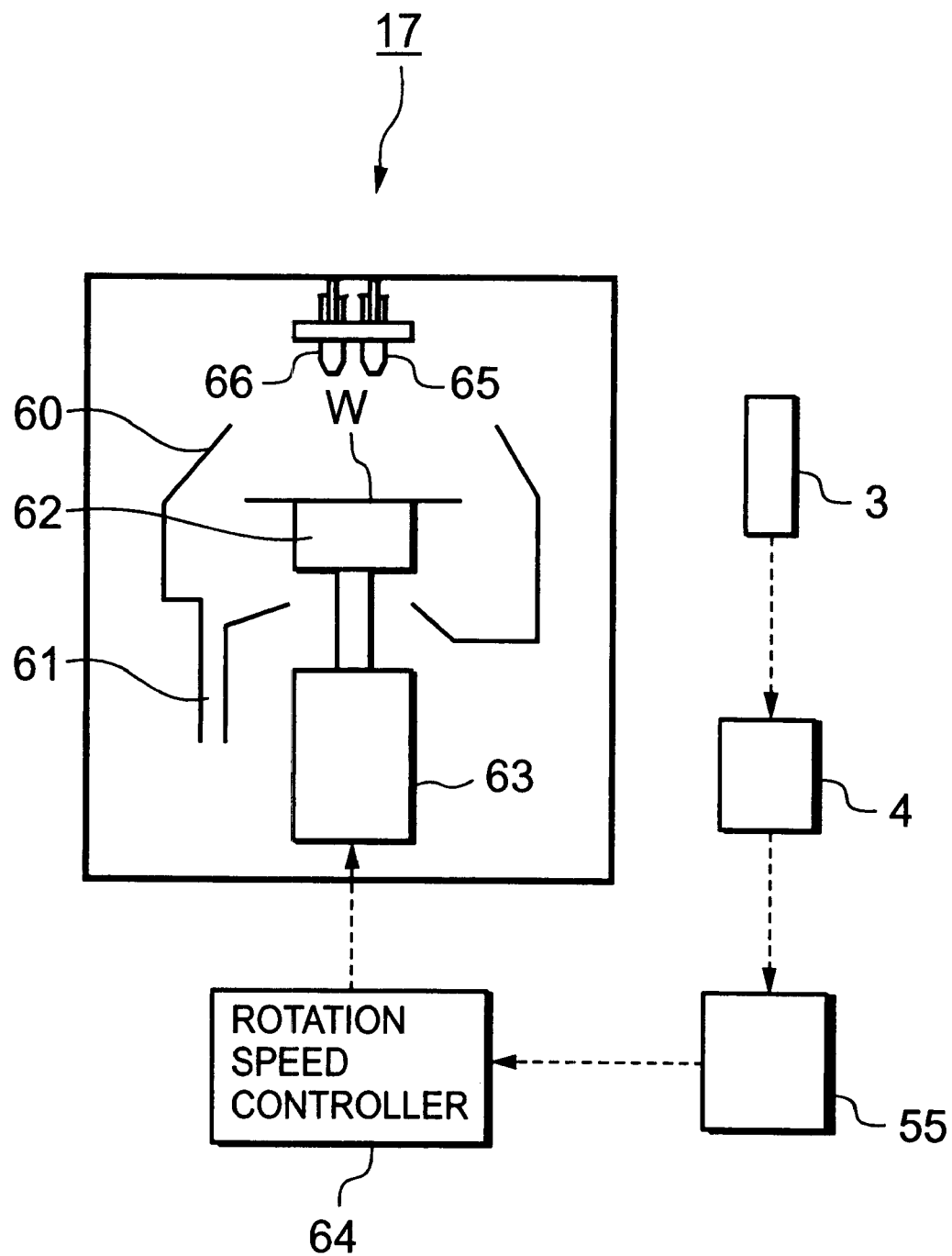
FIG. 6 is a schematic view showing the schematic structure of the substrate processing system according to the first embodiment.

As shown in FIG. 5, the resist coating unit 17 has a cup for housing the wafer W under processing in a casing 17a. The cup 60 is structured to be open at the upper portion thereof and surround the side and the underside of the wafer W under processing so as to collect a coating solution flowing about from the peripheral edge of the wafer W. A line 61 for drainage and exhaust and the like are connected to the bottom of the cup 60. A spin chuck for rotating the wafer W on a vertical shaft while holding it in a horizontal position is provided in the cup 60. The spin chuck 62 is rotationally controlled by a motor 63 outside the cup 60. The motor 63 is structured to be controlled by a rotation speed controller 64. Accordingly, the rotation speed of the wafer W can be changed by a command from the rotation speed controller 64. As shown in FIG. 6, the rotation speed controller 64 is connected to the main controller 55 of the coating and developing processing apparatus 1, and the main controller 55 is structured to be able to obtain an atmospheric pressure value from the barometer 3 via the host computer 4.

Provided above the cup 60 are a resist solution supply nozzle 65 for applying a resist solution to the wafer W and a solvent supply nozzle 66 for supplying a solvent for the resist solution to the wafer W.

Figure 7:
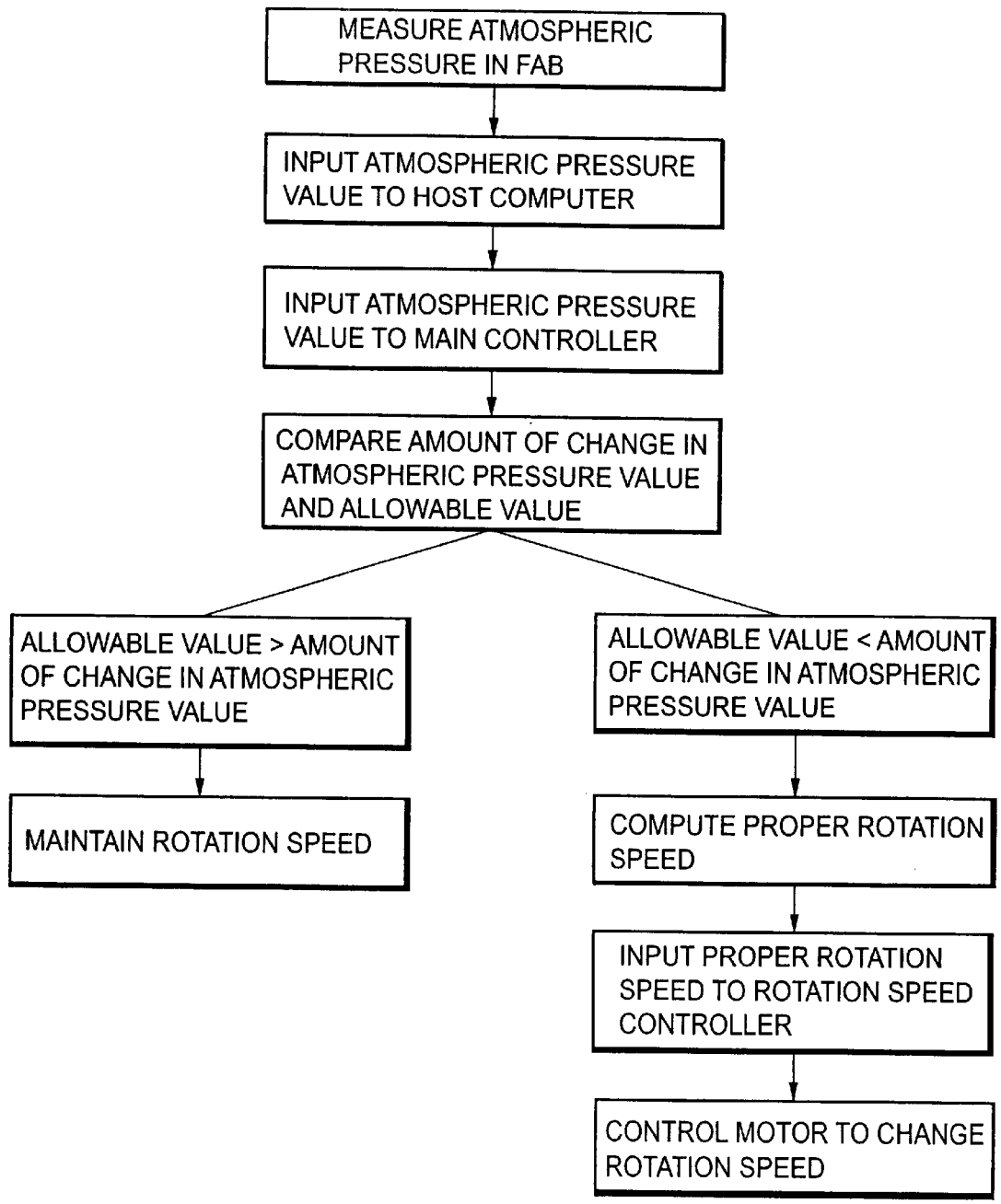
FIG. 7 is a flowchart showing the process of the substrate processing system according to the first embodiment.

Now, the operation of the substrate processing system according to this embodiment will be explained based on FIG. 7.

The atmospheric pressure in the FAB 2 is first measured by the barometer 3 provided in the FAB 2. A measured value is provided to the on-line connected host computer 4 and sent to the main controller 55 in each coating and developing processing apparatus 1 at predetermined time intervals via the host computer 4. Thereafter, when the amount of change between the inputted atmospheric pressure value and a previous atmospheric pressure value exceeds a preset allowable value of atmospheric pressure, the main controller 55 performs correction and computes the rotation speed of the wafer W so that a predetermined film thickness can be obtained, and outputs the data to the rotation speed controller 64 of the resist control unit 17. Meanwhile, when the aforesaid amount of change does not exceed the allowable value, the rotation speed is not computed, and the present rotation speed is maintained. The allowable value is the amount of change in atmospheric pressure (an allowable value) corresponding to the amount of change in film thickness allowable in terms of the performance of the wafer W after previous examination of a correlation between atmospheric pressure and coating film thickness, and set in each of the coating and developing apparatus 1. The rotation speed of the wafer W is computed from the correlation between atmospheric pressure and rotation speed which is previously examined. Each resist solution as a chemical has its own correlation between atmospheric pressure and film thickness or rotation speed, and thus the correlation between them needs to be examined according to the type of resist solution, and setting is performed in respective coating and developing processing apparatus 1 depending on the type of resist solution.

Subsequently, the rotation speed controller 64 to which the data of computed rotation speed are inputted controls the motor 63 based on the data.

Thereafter, the wafer W is suction-held by the spin chuck 62 in the cup 60, and rotated at a rotation speed controlled according to atmospheric pressure as described above. Moreover, a resist solution is supplied from the resist solution supply nozzle 65, and a resist film is formed.

As described above, in the substrate processing system according to this embodiment, one barometer 3 is provided in the FAB 2, and a measured value by the barometer 3 is sent to each of the coating and developing processing apparatus 1 via the host computer 4 as a central control unit. Hence, the provision of a barometer in each processing apparatus is unnecessary, thereby not complicating the inside of the processing apparatus, and holding down plant and equipment investment, resulting in a reduction in cost. Furthermore, an allowable value to the amount of change in atmospheric pressure is previously set, and control is carried out only when the allowable value is exceeded, and thus control can be performed by extremely simple algorithm, thereby making it possible to prevent excessive control and keep uniformity of a coating film by the minimum necessary control. By providing the host computer as above, an atmospheric pressure value from the barometer can be sent to a plurality of rotary coating units all at once, which facilitates the control of the plurality of rotary coating units in a room. Moreover, each of the rotary coating units can judge individually whether the control of rotation speed is needed or not based on the atmospheric pressure value sent from the host computer.

Figure 8:
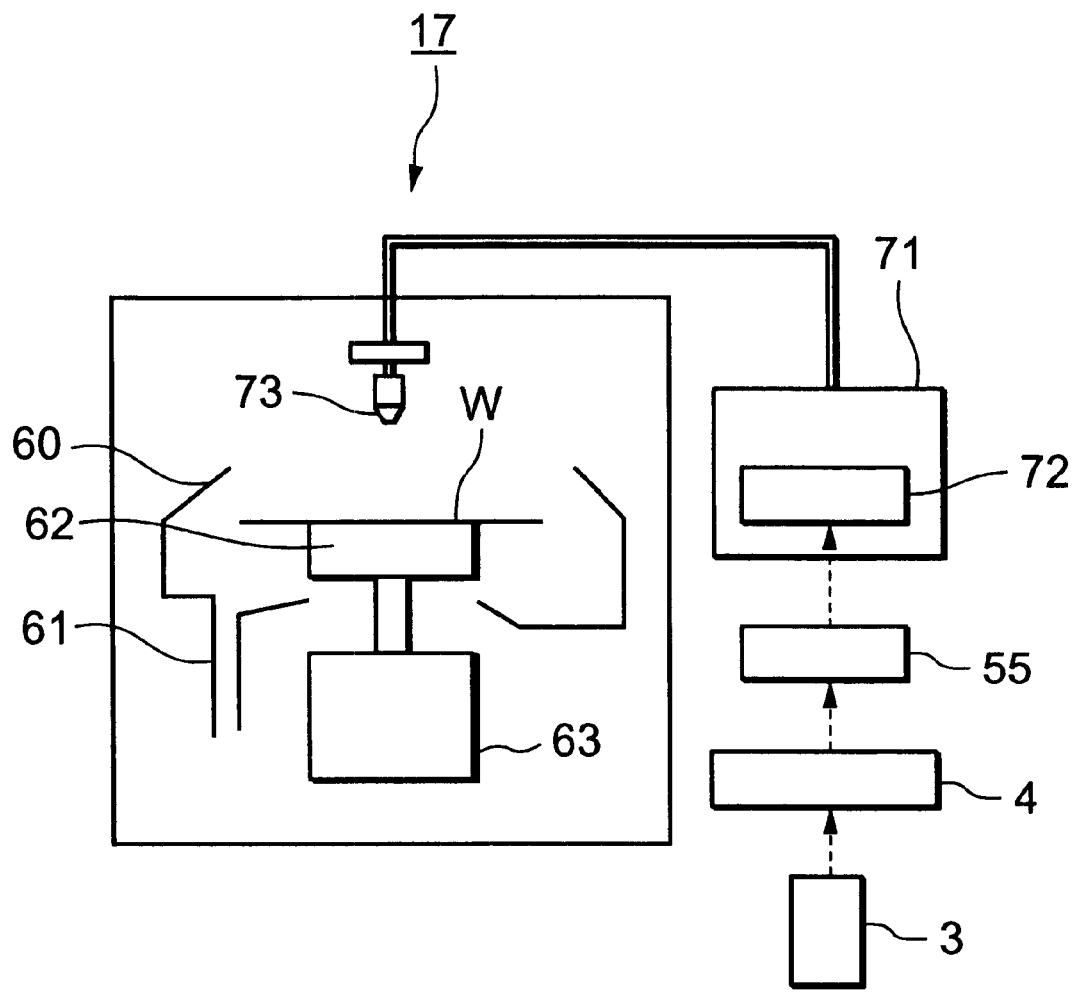
FIG. 8 is a schematic view showing the schematic structure of a substrate processing system according to a second embodiment.

Next, a substrate processing system according to a second embodiment will be explained based on FIG. 8. The substrate processing system of the second embodiment, similarly to the first embodiment, includes the barometer 3 and a plurality of coating and developing processing apparatus 1 in the FAB 2. Data from the barometer 3 are sent to each coating and developing processing apparatus 1 via the host computer 4. Provided in the coating and developing processing apparatus 1 is the main controller 55 having the function of computing a control value from the received data. In the resist coating unit 17 in the coating and developing processing apparatus 1, a resist and solvent mixing device 71 for mixing a resist solution and a solvent is provided, and the resist and solvent mixing device 71 includes a mixing ratio control mechanism 72 for controlling the mixing ratio of the resist solution to the solvent.

Figure 9:
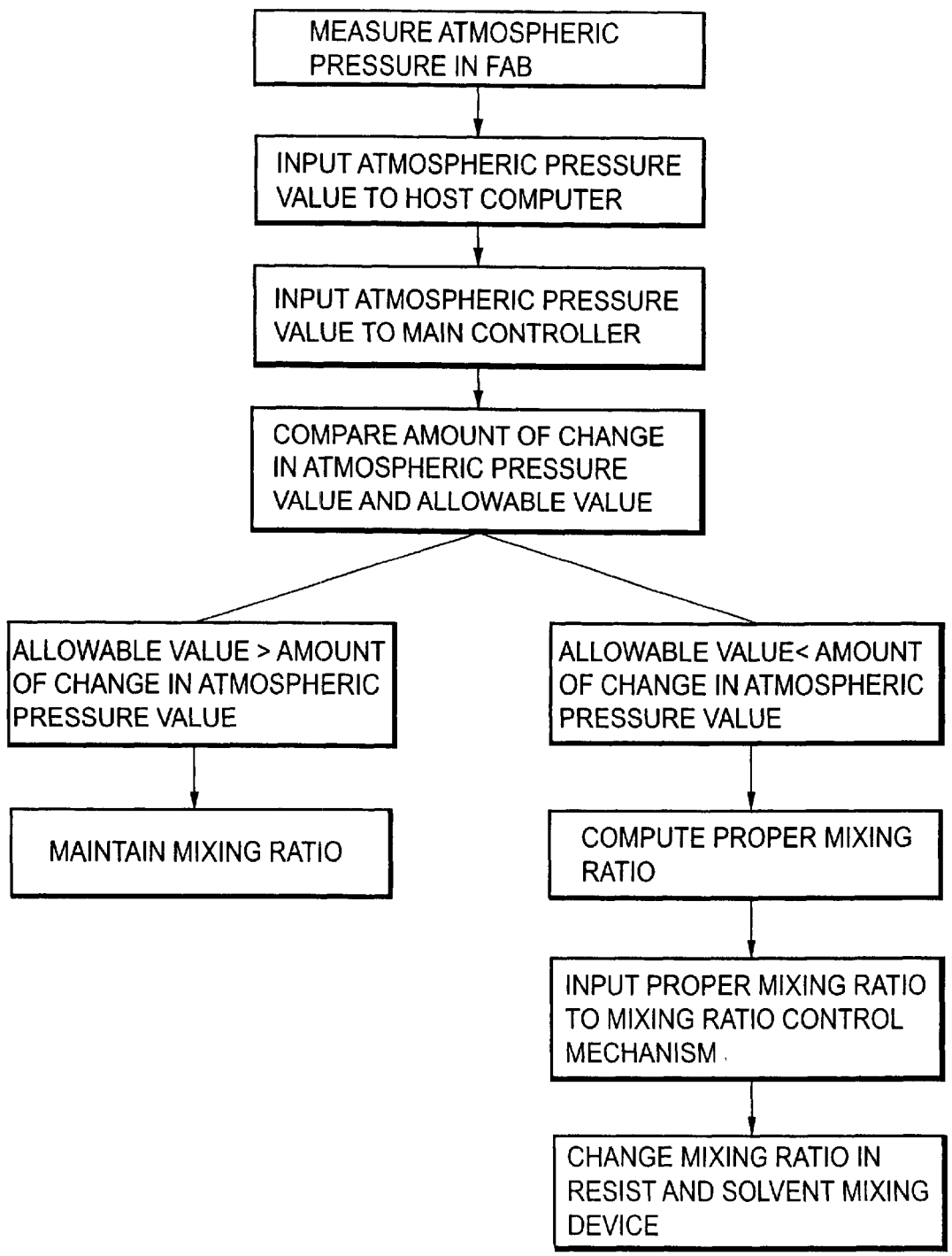
FIG. 9 is a flowchart showing the process of the substrate processing system according to the second embodiment.

Next, the process of the substrate processing system according to the second embodiment will be explained based on FIG. 9. An atmospheric pressure value measured by the barometer 3 is inputted to the main controller 55 of each coating and developing processing apparatus 1 via the host computer 4. Thereafter, the amount of change between the inputted measured value and a previous measured value is preset. Then, when the amount of change between the inputted atmospheric pressure value and the previous atmospheric pressure value exceeds a preset allowable value of atmospheric pressure, the main controller 55 performs correction and computes the mixing ratio of the resist solution to the solvent so that the viscosity of a chemical composed of the resist solution and the solvent to be discharged from a nozzle 73 is changed to obtain a predetermined film thickness, and outputs the data to the mixing ratio control mechanism 72 in the resist and solvent mixing device 71. Meanwhile, when the aforesaid amount of change does not exceed the allowable value, the mixing ratio of the resist solution to the solvent is not computed, and the present mixing ratio is maintained. The allowable value is the amount of change in atmospheric pressure (an allowable value) corresponding to the amount of change in film thickness allowable in terms of the performance of the wafer W after previous examination of a correlation between atmospheric pressure and coating film thickness, and set in each of the coating and developing apparatus 1. The mixing ratio of the resist solution to the solvent is computed from the correlation between atmospheric pressure and coating film thickness which is previously examined. Each resist solution has its own correlation between atmospheric pressure and film thickness or mixing ratio of the resist solution to the solvent, and thus the correlation between them needs to be examined according to the type of resist solution, and setting is performed in respective coating and developing processing apparatus 1 depending on the type of resist solution.

Thereafter, the mixing ratio is controlled by the mixing ratio control mechanism 72 based on the computed mixing ratio, and mixing is performed in the resist and solvent mixing device 71.

The wafer W is then suction-held by the spin chuck 62 and rotated by the motor 63. Moreover, a mixed solution of the resist solution and the solvent of which the mixing ratio is controlled depending on atmospheric pressure as described above is applied to the upper face of the wafer W, and a resist film is formed.

As described above, in the substrate processing system for the wafer W according to the second embodiment, similarly to the first embodiment, the provision of the barometer 3 in each coating and developing processing apparatus 1 is unnecessary, thereby not complicating the inside of the coating processing unit, and holding down plant and equipment investment, resulting in a reduction in cost. Furthermore, an allowable value to the amount of change in atmospheric pressure is previously set, and control is carried out only when the allowable value is exceeded, and thus control can be performed by extremely simple algorithm, thereby making it possible to prevent excessive control and maintain uniformity of a coating film by the minimum necessary control.

Moreover, the control of rotation speed and mixing ratio which are described respectively in the first embodiment and the second embodiment may be combined. The combination of them enables finer control.

Figure 10:
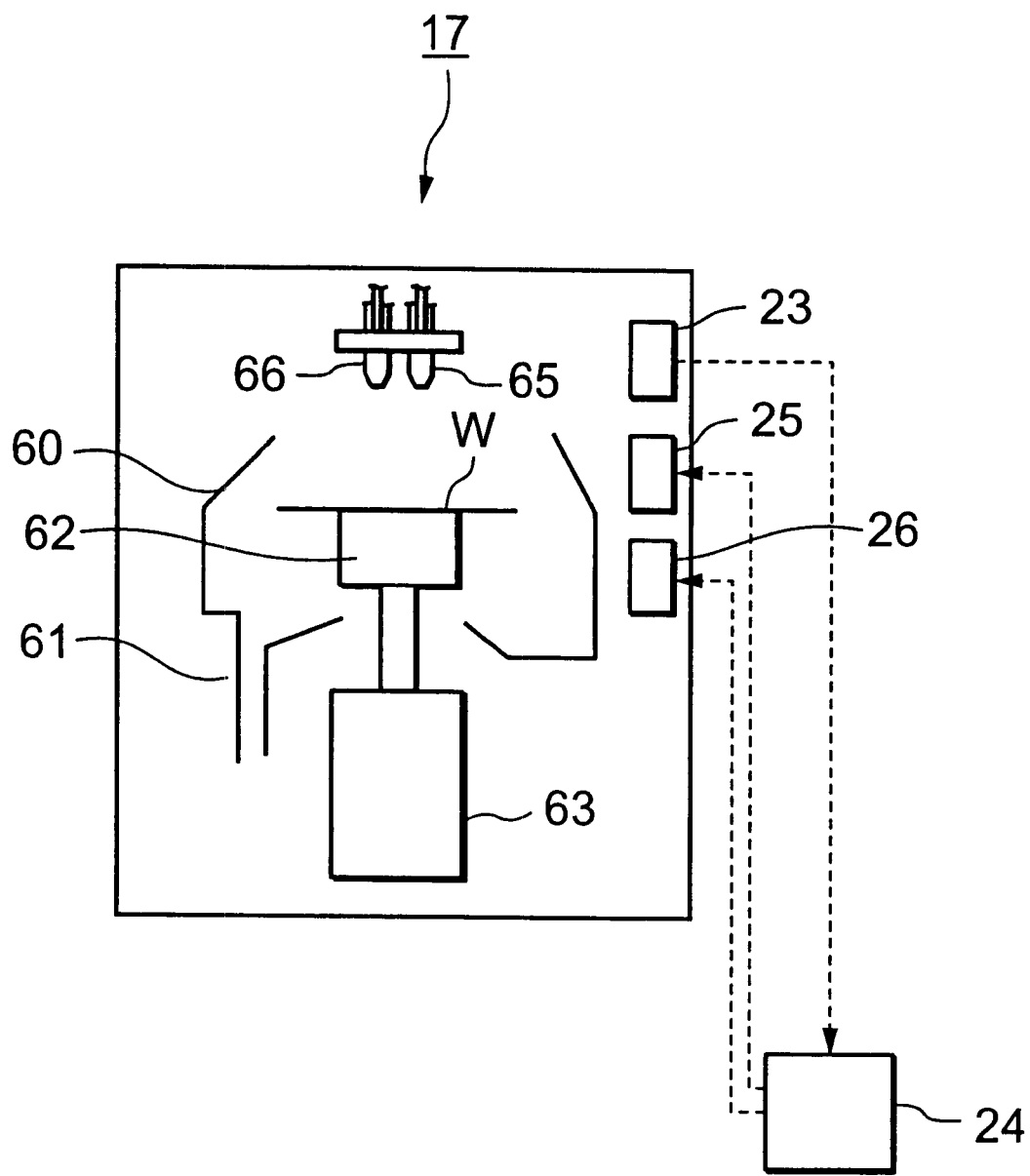
FIG. 10 is a schematic view showing the schematic structure of a substrate processing system according to a third embodiment.
Figure 11:
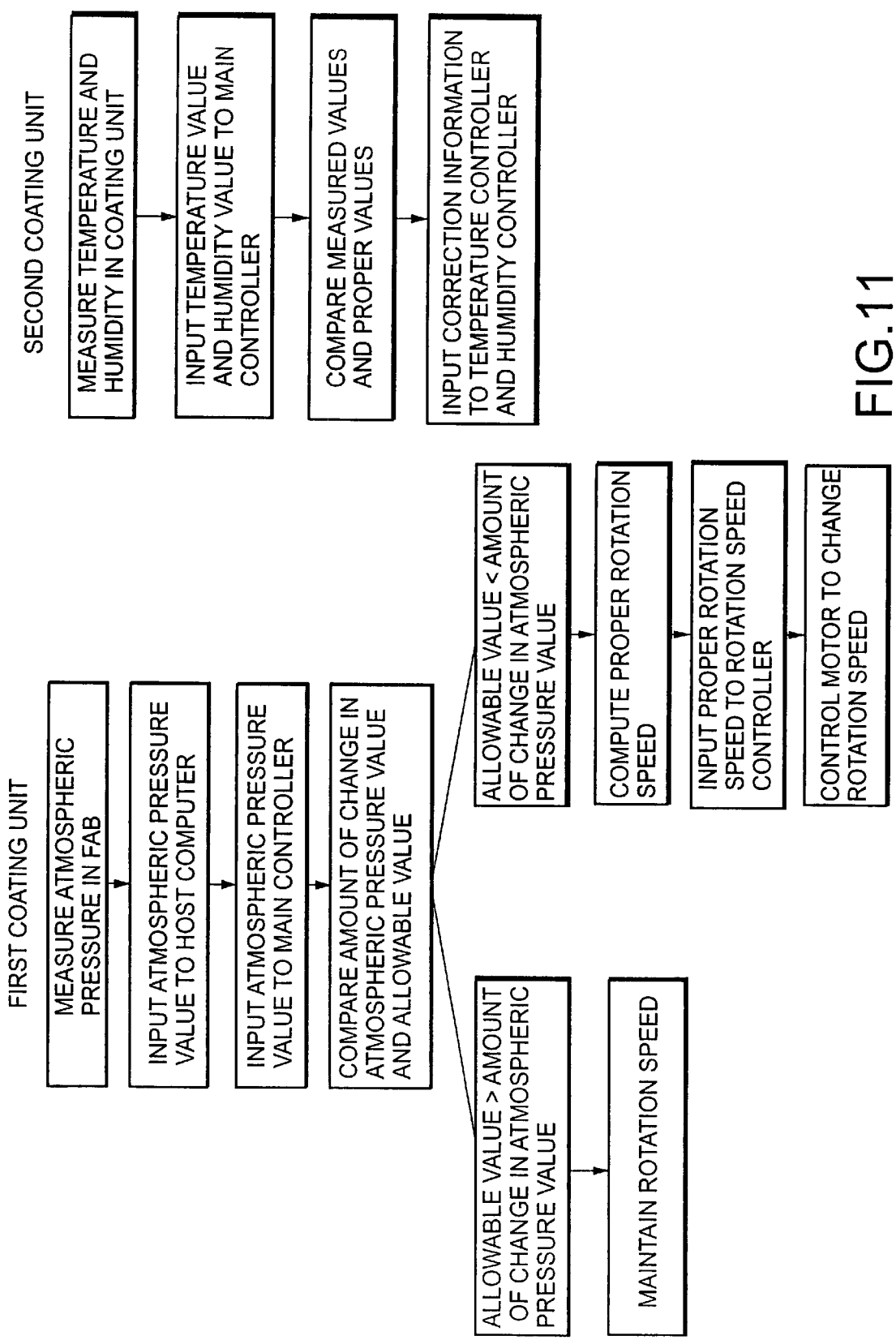
FIG. 11 is a flowchart showing the process of the substrate processing system according to the third embodiment.

Next, a substrate processing system according to a third embodiment will be explained based on FIG. 10 and FIG. 11. FIG. 10 is a schematic sectional view of a resist coating unit for explaining part of the system. FIG. 11 is a chart for explaining the process of the substrate processing system according to the third embodiment.

The substrate processing system of the third embodiment, similarly to the first embodiment, includes the barometer 3 and a plurality of coating and developing processing apparatus 1 in the FAB 2. The system of the third embodiment is different from that of the first embodiment in that data from the barometer 3 are sent to part of the coating and developing processing apparatus 1 via the host computer 4 and are not sent to the other coating and developing processing apparatus 1. In this embodiment, a chemical (hereinafter referred to as a first chemical) to be supplied to the resist coating unit 17 (hereinafter referred to as a first coating unit) in the coating and developing processing apparatus 1 to which the data from the barometer 3 are sent, and a chemical (hereinafter referred to as a second chemical) to be supplied to the resist coating unit 17 (hereinafter referred to as a second coating unit) in the coating and developing processing apparatus 1 to which the data from the barometer 3 are not sent contain different resist solutions respectively. The first chemical mainly has a property that film thickness remarkably changes with a change in the atmospheric pressure in a processing chamber, whereas the second chemical has a property that film thickness remarkably changes with a change in the temperature and humidity in the processing chamber without being influenced so much by a change in the atmospheric pressure in the processing chamber. The first coating unit has the same system in the first embodiment. Each of the second coating units 17 includes a temperature and humidity indicator 23, a main controller 24, a temperature controller 25, and a humidity controller 26. Temperature conditions and humidity conditions suitable for coating in a desired film thickness when the second chemical is used are previously inputted to the main controller 24.

Now, the process of the substrate processing system according to this embodiment will be explained. The first coating unit goes through the same process as in the first embodiment, and thus the explanation thereof is omitted. In the second coating unit 17, the temperature and humidity in the second coating unit 17 are first measured by the temperature and humidity indicator 23. Measured values are inputted to the main controller 24, and compared with proper values previously inputted. Thereafter, in the main controller 24, correction information is computed so that the measured values become the proper values, and the correction information is inputted to the temperature controller 25 and the humidity controller 26, respectively. The temperature controller 25 and the humidity controller 26 regulate the temperature and the humidity in the coating unit 17 based on the correction information. Thereafter, in the second coating unit, the second chemical is supplied onto the wafer W under suitable temperature and humidity conditions controlled depending on atmospheric pressure as described above. Meanwhile, in the first coating unit, the first chemical is supplied onto the wafer W while the wafer is being rotated at a rotation speed controlled depending on atmospheric pressure as described above.

A system which can select the control of rotation speed or the control of temperature and humidity according to the type of resist can be also provided as described above.

Figure 12:
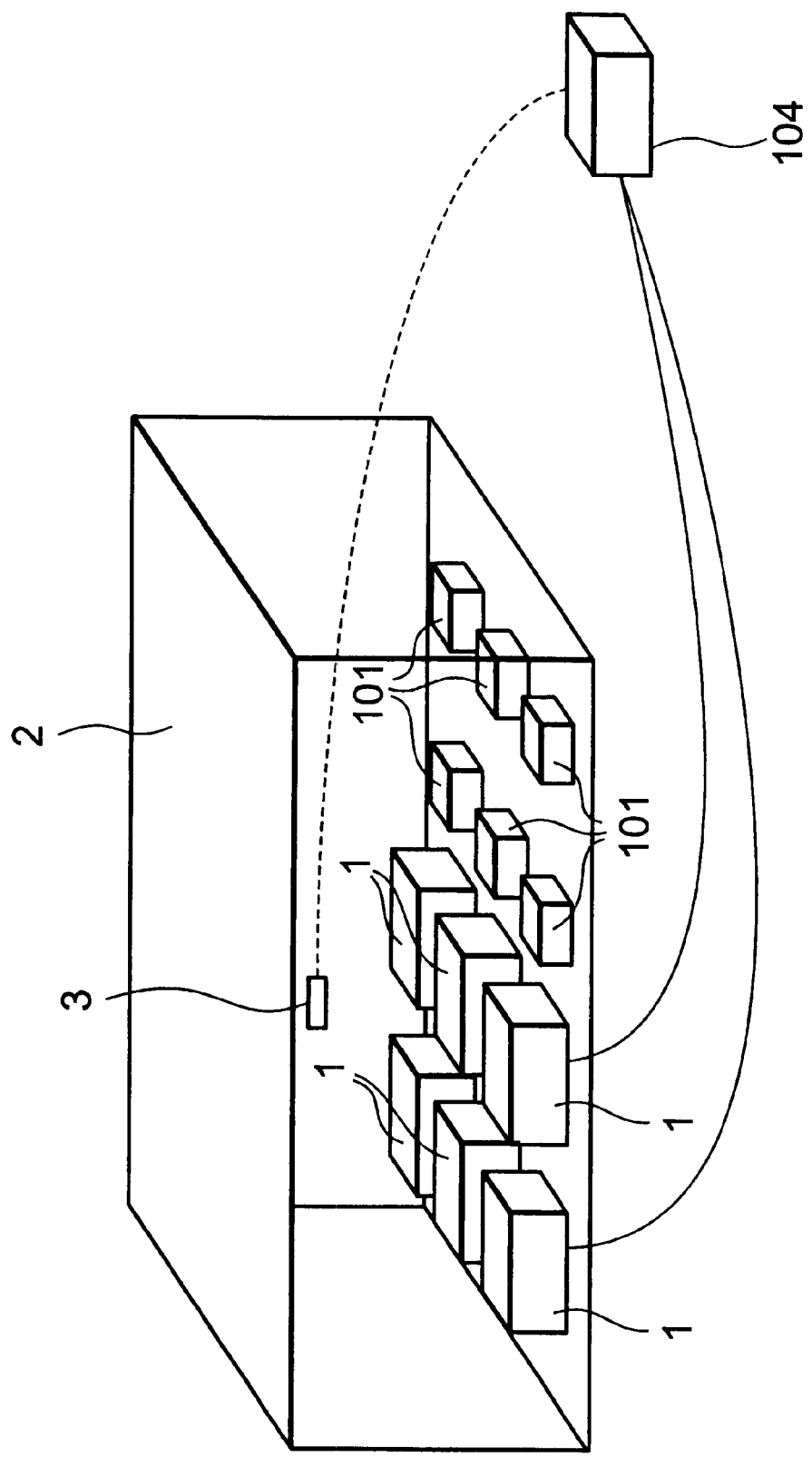
FIG. 12 is a schematic view of a substrate processing system according to a fourth embodiment.

Next, a substrate processing system according to a fourth embodiment will be explained by means of FIG. 12 to FIG. 14. The substrate processing system of the fourth embodiment, similarly to the first embodiment, includes the barometer 3 and a plurality of coating and developing processing apparatus 1 in the FAB 2. Data from the barometer 3 are sent to each of the coating and developing processing apparatus 1 via a host computer 104 and a main controller 155. The operation of the host computer 104 in the fourth embodiment is different from that in the first embodiment because aligners 101 are further provided in the FAB 2. The explanation of the same structure in the first embodiment will be omitted below.

Figure 13:
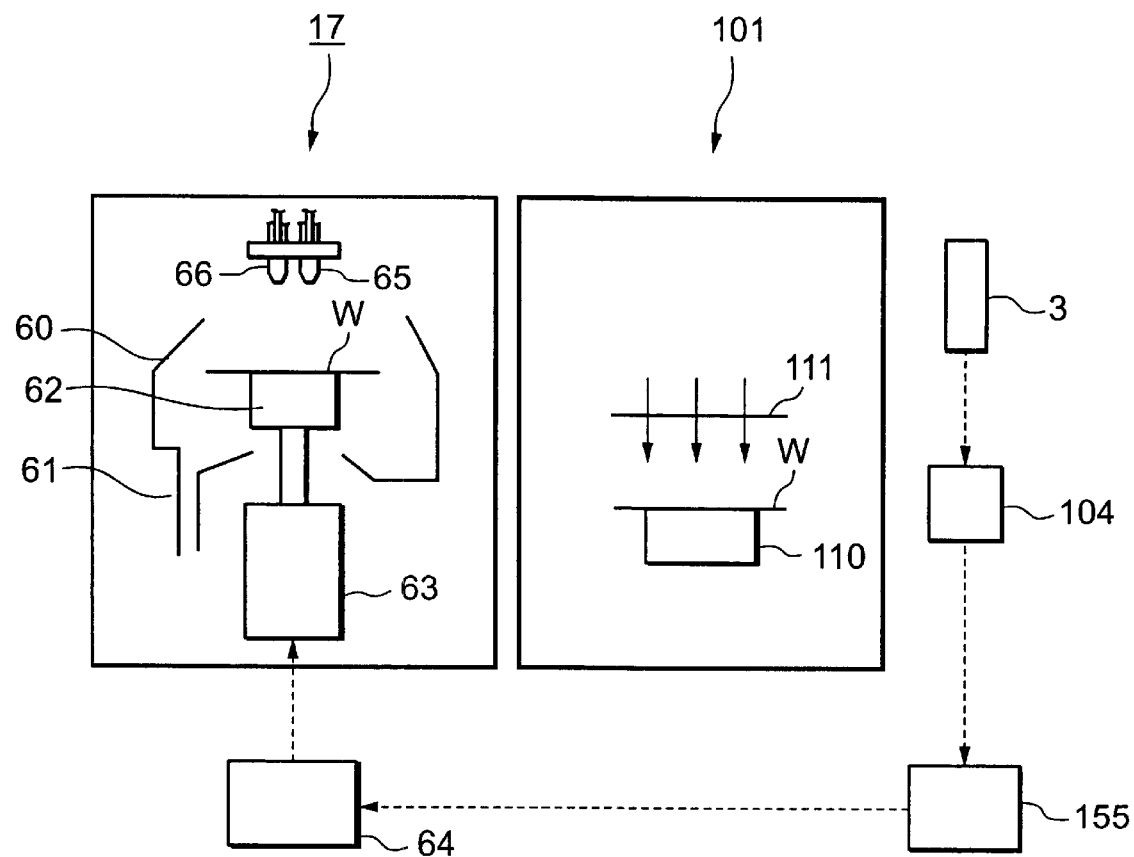
FIG. 13 is a schematic view showing the schematic structure of the substrate processing system according to the fourth embodiment.
Figure 14:
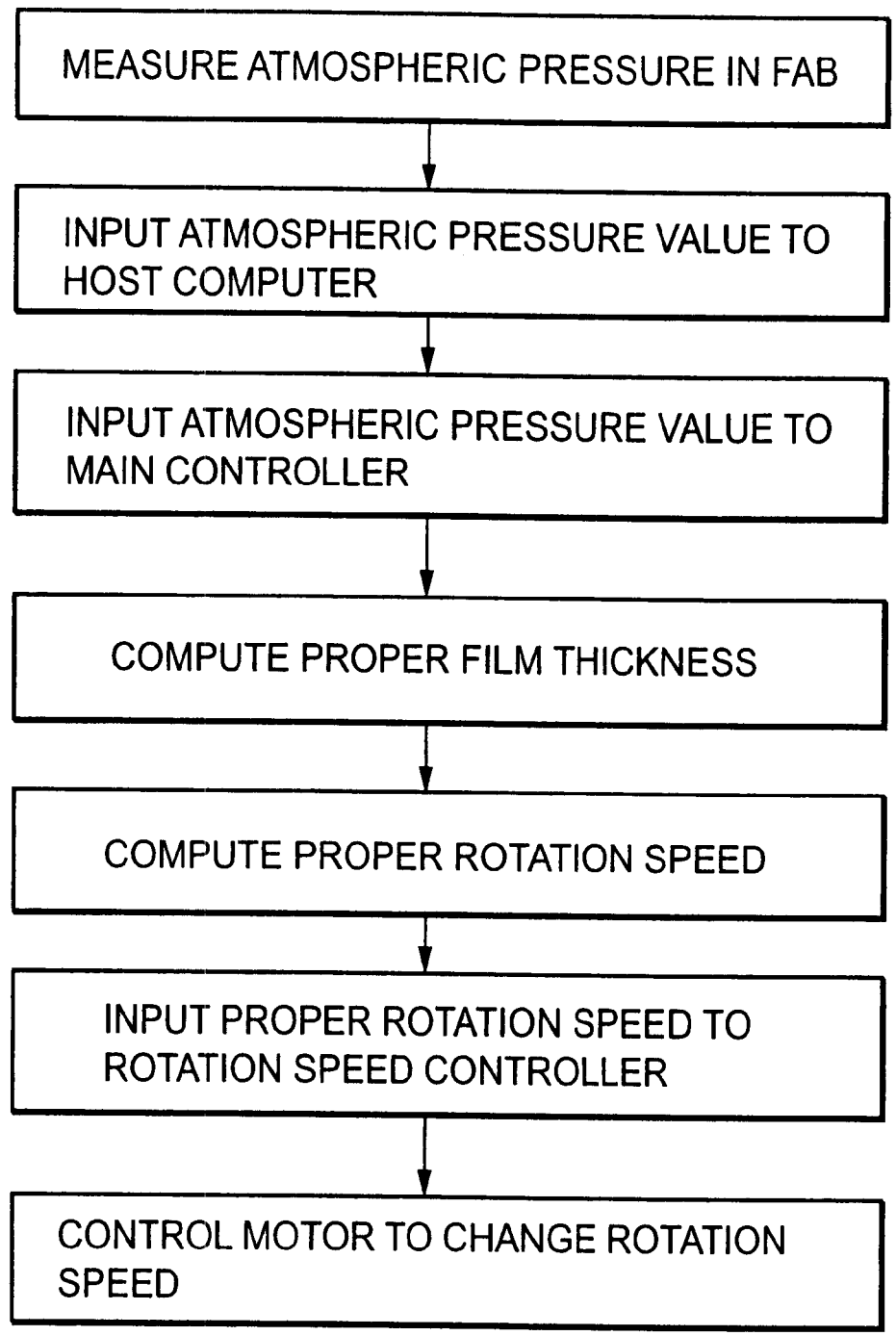
FIG. 14 is a flowchart showing the process of the substrate processing system according to the fourth embodiment.

As shown in FIG. 13, provided in the aligner 101 are a mounting table 110 for mounting the wafer W on which a coating film applied in the coating processing unit 17 is formed thereon and light irradiating means not illustrated for irradiating a light beam to the coating film through a photo mask 111. An atmospheric pressure value from the barometer 3 is inputted to the main controller 155 of the coating and developing processing apparatus 1 via the host computer 104, and the rotation speed controller 64 is connected to the main controller 155. The relation between atmospheric pressure and the size of a photo-resist pattern, and the relation between the thickness of the coating film and the size of the photo-resist pattern at the time of exposure are previously inputted as data to the main controller 155. These data are different from one resist solution to another, and thus checked according to the type of resist solution and set in respective coating and developing processing apparatus 1 individually.

Now, the process of the substrate processing system according to this embodiment will be explained.

The atmospheric pressure in the FAB 2 is first measured by the barometer 3 provided in the FAB 2. A measured value is provided to the on-line connected host computer 104 and sent to the main controller 155 in each coating and developing processing apparatus 1 at predetermined time intervals via the host computer 104. Thereafter, in the main controller 155, the thickness of a coating film capable of obtaining a photo-resist pattern with a desired size under the measured atmospheric pressure is computed based on the previously inputted data. The rotation speed of the wafer W is computed so that this film thickness is obtained, and the data are outputted to the rotation speed controller 64 of the resist coating unit 17.

Subsequently, the rotation speed controller 64 to which the data of computed rotation speed are inputted controls the motor 63 based on the data.

Thereafter, the wafer W is suction-held by the spin chuck 62 in the cup 60, and rotated at a rotation speed controlled according to atmospheric pressure as described above. Moreover, a resist solution is supplied from the resist solution supply nozzle 65, and a resist film is formed. The resist film is then subjected to exposure processing in the aligner 101 and developing processing, and thereby a photo-resist pattern is obtained.

The thickness of a coating film can be controlled in consideration of a change in the size of a photo-resist pattern due to a change in atmospheric pressure at the time of exposure as described above. As a result, a photo-resist pattern with a stable size can be always obtained without being influenced by a change in atmospheric pressure.

Figure 15:
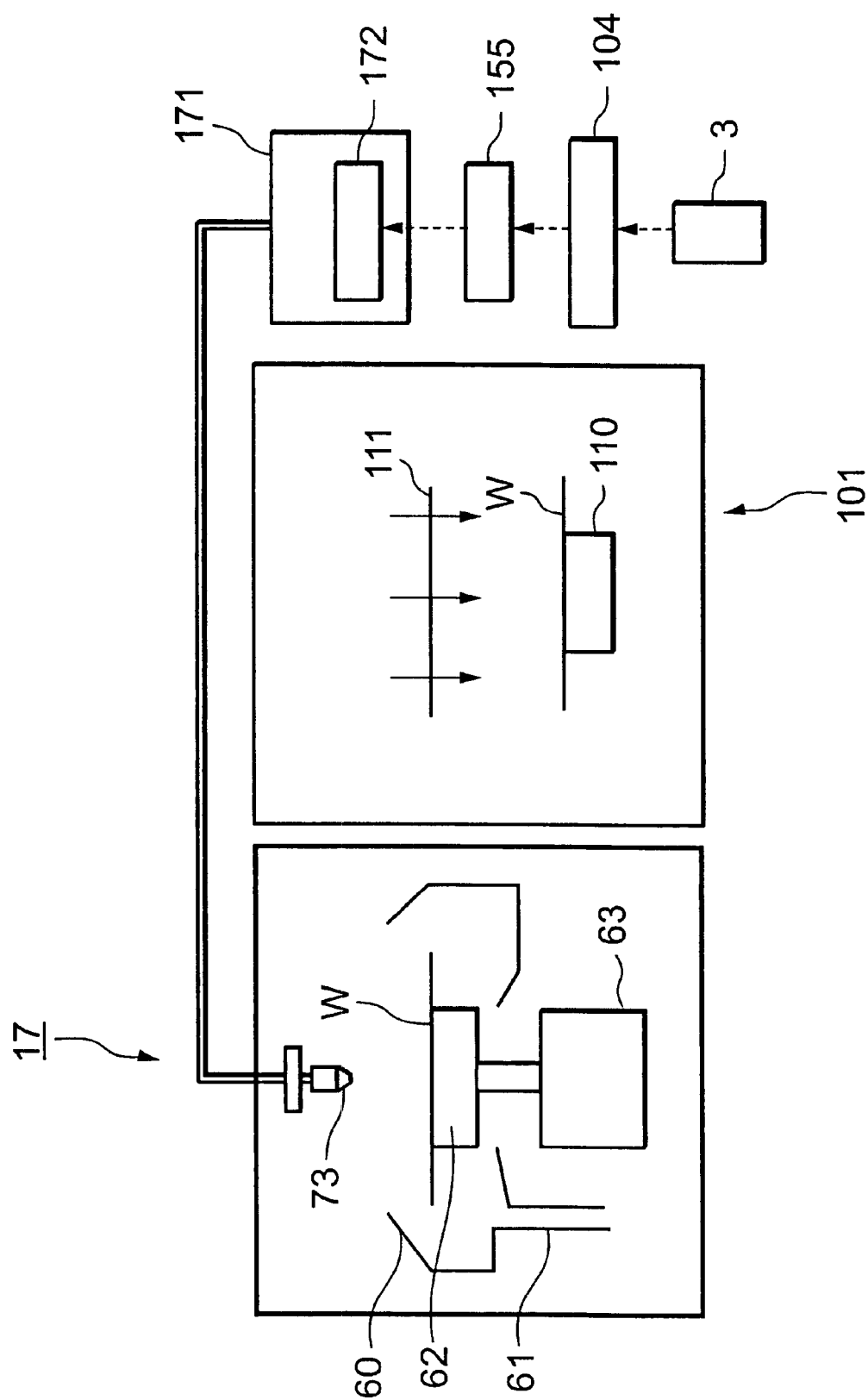
FIG. 15 is a schematic view showing the schematic structure of a substrate processing system according to a fifth embodiment.
Figure 16:
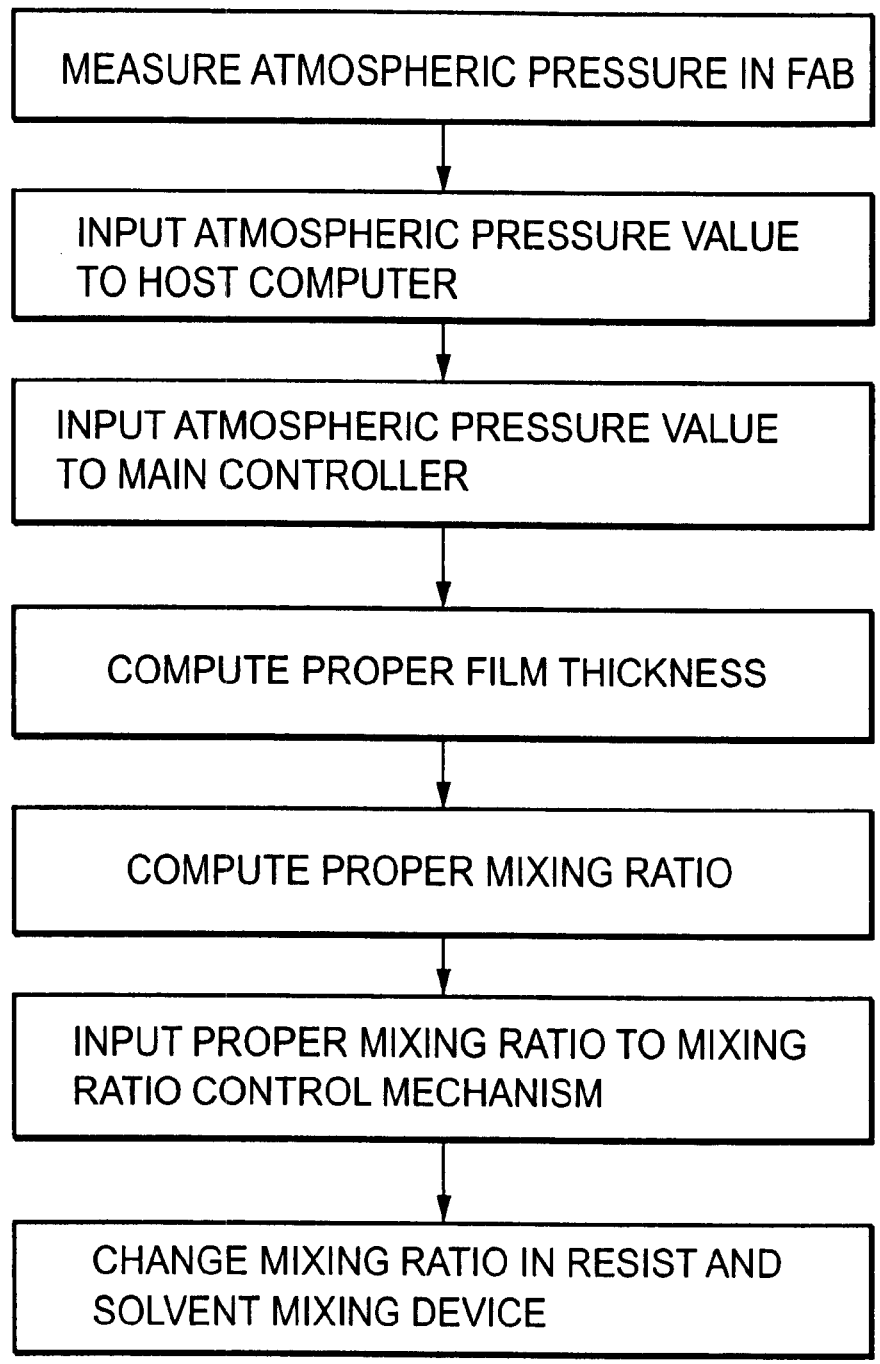
FIG. 16 is a flowchart showing the process of the substrate processing system according to the fifth embodiment.

Next, a substrate processing system according to a fifth embodiment will be explained by means of FIG. 12, FIG. 15, and FIG. 16. The substrate processing system of the fifth embodiment, similarly to the fourth embodiment, includes the barometer 3, a plurality of coating and developing processing apparatus 1 and aligners 101 in the FAB 2. Data from the barometer 3 are sent to each of the coating and developing processing apparatus 1 via the host computer 104 and the main controller 155. The rotation speed of the wafer W is controlled according to a change in atmospheric pressure in the fourth embodiment, whereas the mixing ratio of the resist solution to the solvent is controlled according to a change in atmospheric pressure in the fifth embodiment. Provided in the coating and developing processing apparatus 1 is the main controller 155 having the function of computing a control value from the received data. In the resist coating unit 17 in the coating and developing processing apparatus 1, a resist and solvent mixing device 171 for mixing the resist solution and the solvent is provided, and the resist and solvent mixing device 171 includes a mixing ratio control mechanism 172 for controlling the mixing ratio of the resist solution to the solvent. The relation between atmospheric pressure at the time of exposure and the size of a photo-resist pattern, and the relation between the thickness of the coating film and the size of the photo-resist pattern are previously inputted as data to the main controller 155. These data are different from one resist solution to another, and thus checked according to the type of resist solution and set in respective coating and developing processing apparatus 1 individually.

Next, the process of the substrate processing system according to the fifth embodiment will be explained based on FIG. 16. An atmospheric pressure value measured by the barometer 3 is inputted to the main controller 155 of each of the coating and developing processing apparatus 1 via the host computer 104. Thereafter, in the main controller 155, the thickness of a coating film capable of obtaining a photo-resist pattern with a desired size under the measured atmospheric pressure is computed based on the previously inputted data. The mixing ratio of the resist solution to the solvent is computed so that the viscosity of a chemical to be discharged from the nozzle 73 is changed to obtain the aforesaid film thickness, and the data is outputted to the mixing ratio control mechanism 172 in the resist and solvent mixing device 171.

Thereafter, the mixing ratio is controlled by the mixing ratio control mechanism 172 based on the computed mixing ratio, and the resist solution and the solvent are mixed in the resist and solvent mixing device 171.

The wafer W is then suction-held by the spin chuck 62 and rotated by the motor 63. Moreover, a mixed solution of the resist solution and the solvent of which the mixing ratio is controlled depending on atmospheric pressure is applied to the upper face of the wafer W, and a resist film is formed.

The resist film as a coating film is then subjected to exposure processing in the aligner 101 and developing processing in the developing processing unit, and a photo-resist pattern is formed.

As described above, the substrate processing system for the wafer W according to the fifth embodiment can control the thickness of a coating film, in view of a change in the size of a photo-resist pattern due to a change in atmospheric pressure at the time of exposure. As a result, a photo-resist pattern with a stable size can be always obtained without being influenced by a change in atmospheric pressure.

Figure 17:
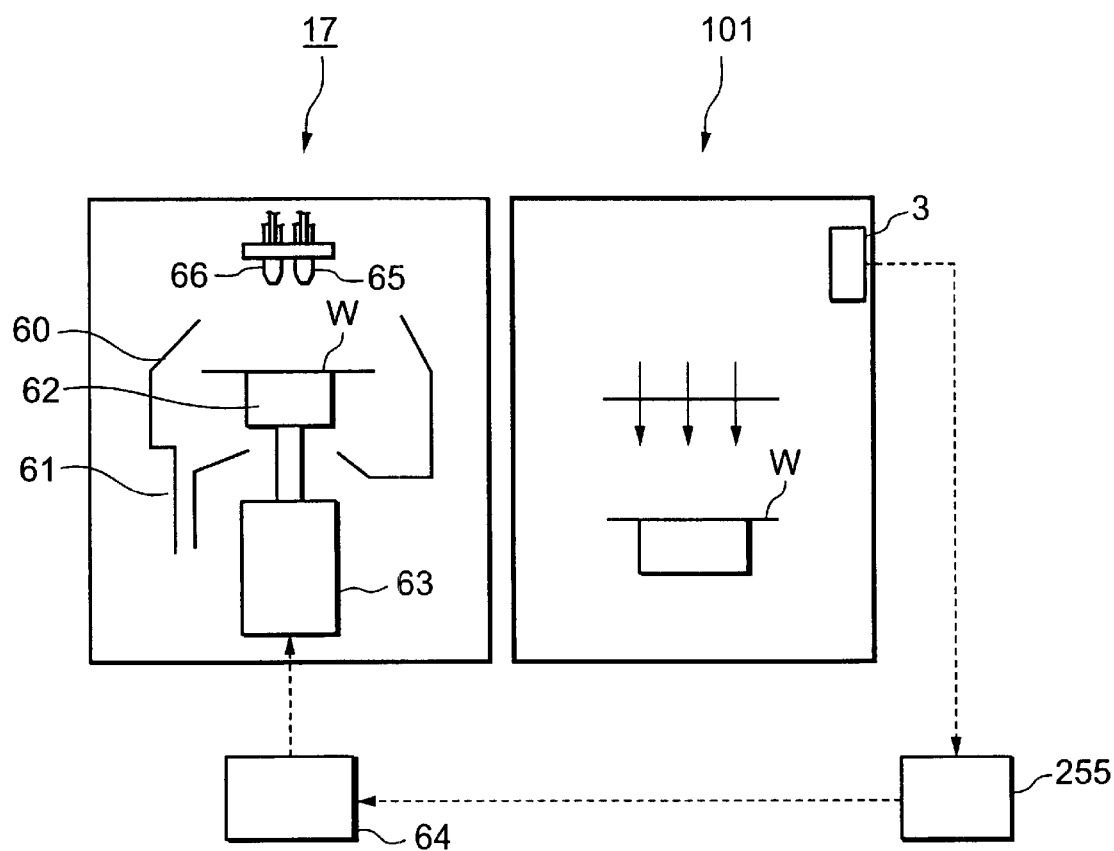
FIG. 17 is a schematic view showing the schematic structure of a substrate processing system according to a sixth embodiment.
Figure 18:
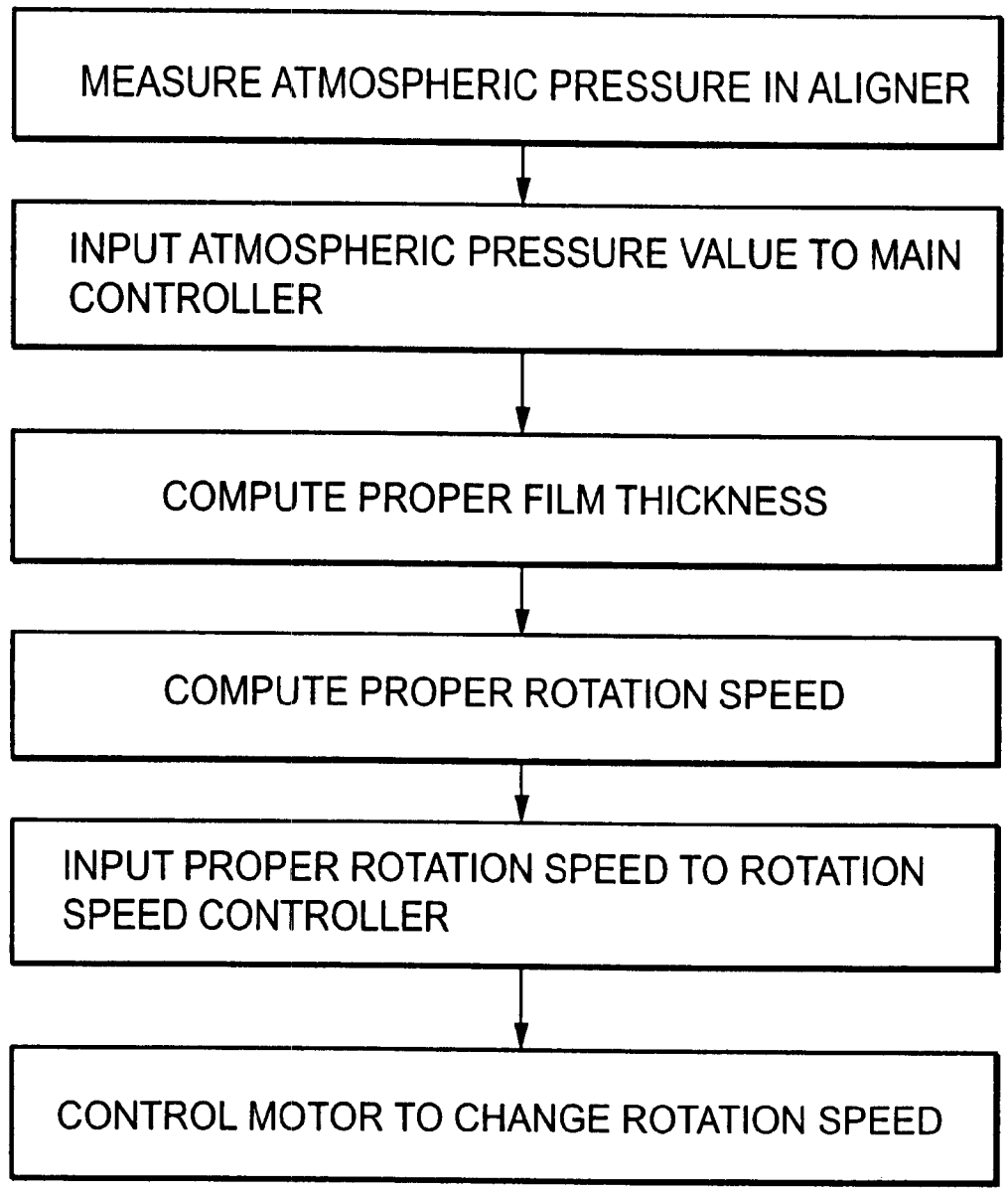
FIG. 18 is a flowchart showing the process of the substrate processing system according to the sixth embodiment.

Next, a substrate processing system according to a sixth embodiment will be explained by means of FIG. 17 and FIG. 18. In the aforesaid fourth embodiment, the coating and developing processing apparatus and the aligners are provided in the same FAB, the barometer 3 is placed in the FAB, and the rotation speed of the wafer W in the coating processing unit in the coating and developing apparatus is controlled by data from the barometer 3, whereas in the sixth embodiment, the barometer 3 is disposed in the aligner 101, and the rotation speed of the wafer W in the coating processing unit 17 is controlled by data from this barometer 3, whereby this system can be also applied to the case where aligners and coating processing units are not placed in the same FAB.

In the system in the sixth embodiment, in the aligner 101, a mounting table 110 for mounting the wafer W on which a coating film applied in the coating processing unit 17 is formed thereon and light irradiating means not illustrated for irradiating a light beam to the coating film through the photo mask 111 are provided, and the barometer 3 is further provided. An atmospheric pressure value from the barometer 3 is inputted to a main controller 255 of the coating processing unit 17, and the rotation speed controller 64 is connected to the main controller 255. The relation between atmospheric pressure at the time of exposure and the size of a photo-resist pattern and the relation between the thickness of the coating film and the size of the photo-resist pattern at the time of exposure are previously in putted as data to the main controller 255. These data are different from one resist solution to another, and thus checked according to the type of resist solution and set individually in respective coating processing units 17 where the resist solutions are to be used.

Now, the process of the substrate processing system according to this embodiment will be explained.

The atmospheric pressure in the aligner 101 is first measured by the barometer 3 provided in the aligner 101. A measured value is sent to the main controller 255 in the coating processing unit 17 at predetermined time intervals. Thereafter, in the main controller 255, the thickness of a coating film capable of obtaining a photo-resist pattern with a desired size under the measured atmospheric pressure is computed based on previously inputted data. The rotation speed of the wafer W is computed so that this film thickness is obtained, and the data are outputted to the rotation speed controller 64 of the resist coating unit 17.

Subsequently, the rotation speed controller 64 to which the data of computed rotation speed are inputted controls the motor 63 based on the data.

Thereafter, the wafer W is suction-held by the spin chuck 62 in the cup 60, and rotated at a rotation speed controlled according to atmospheric pressure as described above. Moreover, a resist solution is supplied from the resist solution supply nozzle 65, and a resist film is formed. The resist film is then subjected to exposure processing in the aligner 101 and developing processing, and a photo-resist pattern is obtained.

The thickness of a coating film can be also controlled in consideration of a change in the size of a photo-resist pattern due to a change in atmospheric pressure at the time of exposure as described above. As a result, a photo-resist pattern with a stable size can be always obtained without being influenced by a change in atmospheric pressure.

Figure 19:
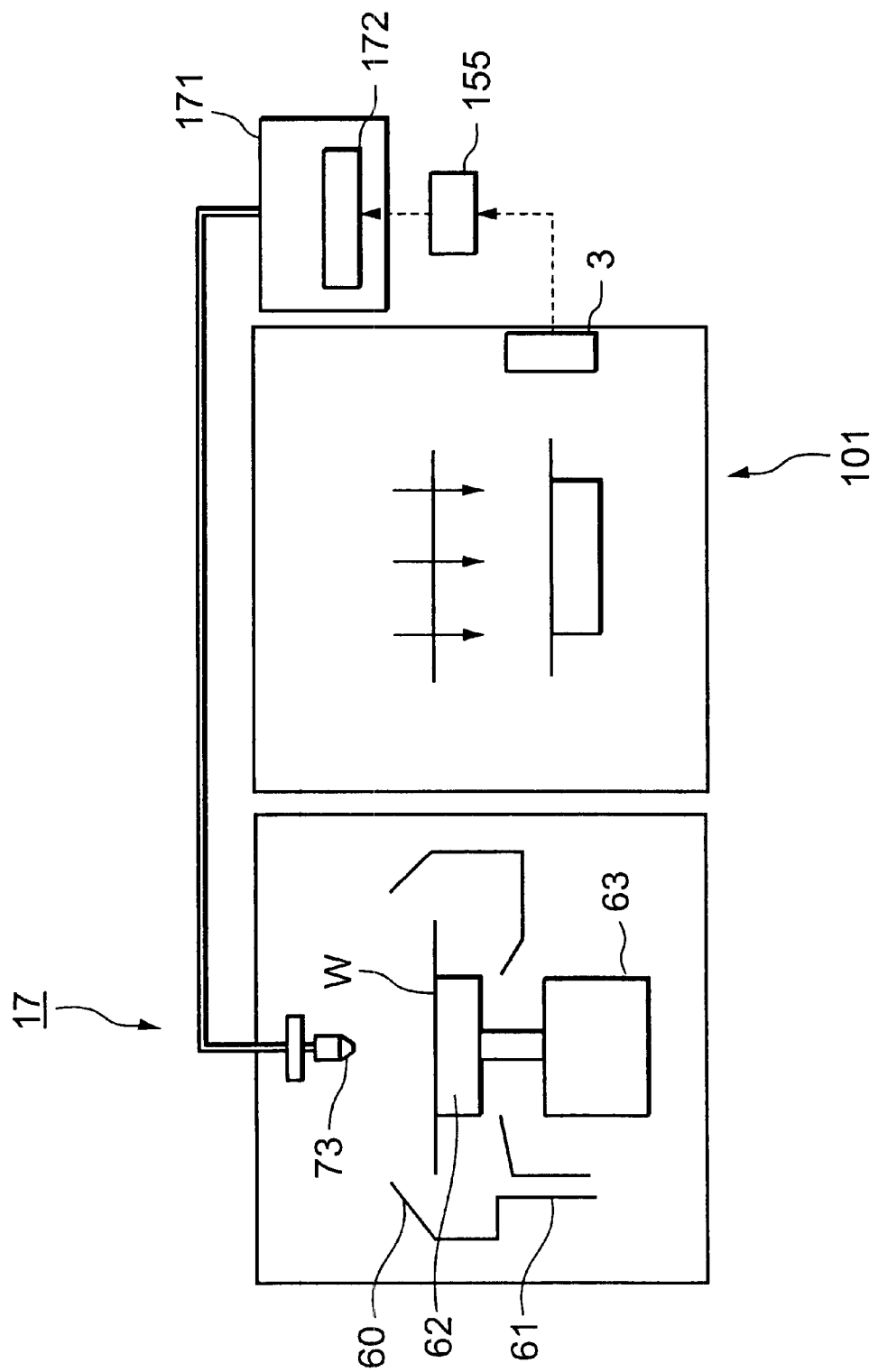
FIG. 19 is a schematic view showing the schematic structure of a substrate processing system according to a seventh embodiment.
Figure 20:
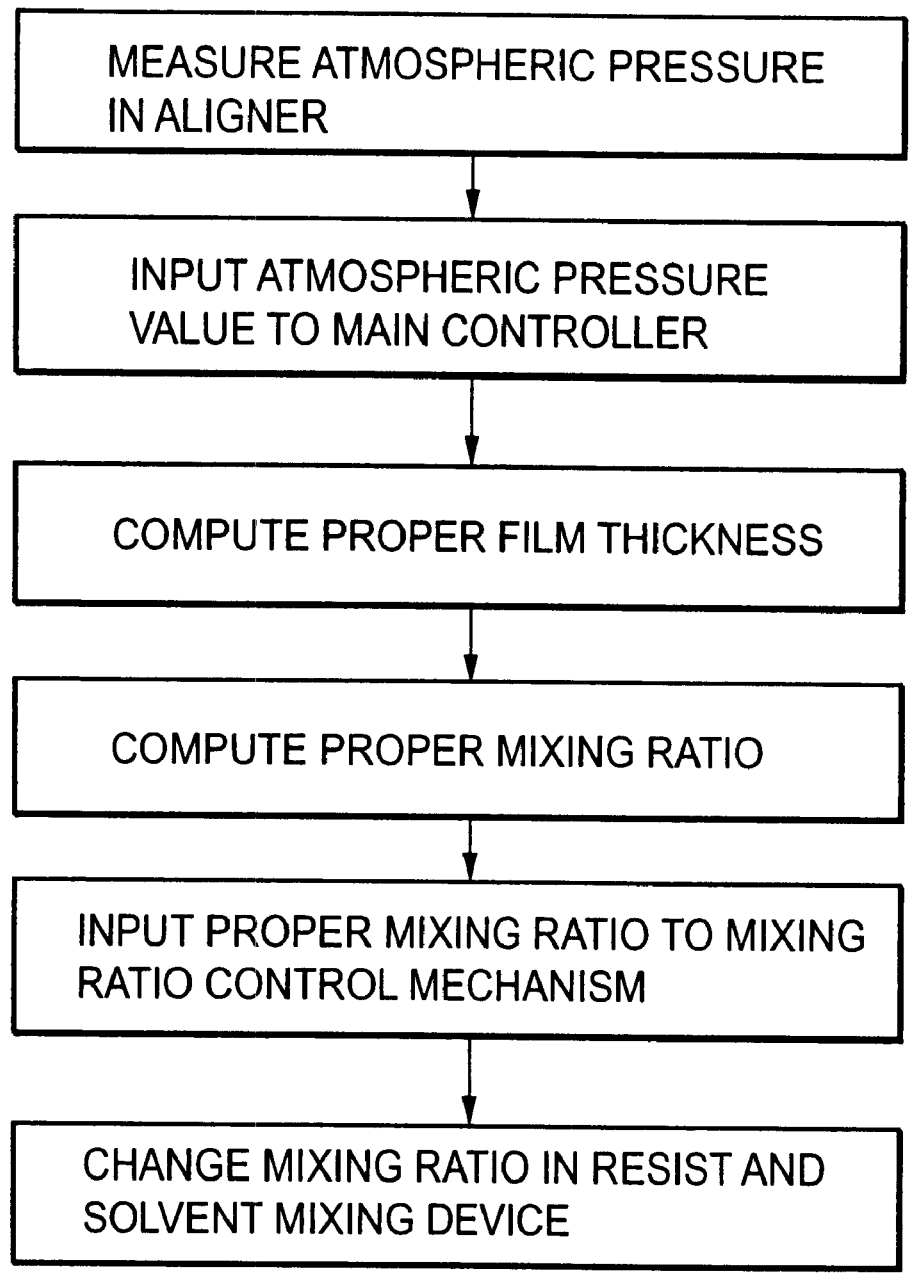
FIG. 20 is a flowchart showing the process of the substrate processing system according to the seventh embodiment.

Next, a substrate processing system according to a seventh embodiment will be explained by means of FIG. 19 and FIG. 20. In the aforesaid fifth embodiment, the coating and developing processing apparatus and the aligners are provided in the same FAB, the barometer 3 is placed in the FAB, and the mixing ratio of the resist solution to the solvent in the chemical to be supplied to the wafer W in the coating processing unit in the coating and developing apparatus is controlled based on data from the barometer 3, whereas in the seventh embodiment, the barometer 3 is disposed in the aligner 101, and the mixing ratio of the resist solution to the solvent in the chemical to be supplied to the wafer W in the coating processing unit 17 is controlled by data from the barometer 3, whereby this system can be also applied to the case where aligners and coating processing units are not placed in the same FAB. Provided in the coating processing unit 17 is the main controller 255 having the function of computing a control value from the received data. In the coating processing unit 17, the resist and solvent mixing device 171 for mixing the resist solution and the solvent composing the chemical is provided, and the resist and solvent mixing device 171 includes the mixing ratio control mechanism 172 for controlling the mixing ratio of the resist solution to the solvent. The relation between atmospheric pressure and the size of a photo-resist pattern, and the relation between the thickness of the coating film and the size of the photo-resist pattern at the time of exposure are previously inputted as data to the main controller 255. These data are different depending on resist solutions, and thus checked according to the type of resist solution and set individually in respective coating and developing processing apparatus 1 where the resist solutions are to be used.

Next, the process of the substrate processing system according to the seventh embodiment will be explained based on FIG. 20. An atmospheric pressure value measured by the barometer 3 is inputted to the main controller 255 of the coating processing unit 17. Thereafter, in the main controller 255, the thickness of a coating film capable of obtaining a photo-resist pattern with a desired size under the measured atmospheric pressure is computed based on previously inputted data. The mixing ratio of the resist solution to the solvent is computed so that the viscosity of the chemical to be discharged from the nozzle 73 is changed to obtain the aforesaid film thickness, and the data is outputted to the mixing ratio control mechanism 172 in the resist and solvent mixing device 171.

Thereafter, the mixing ratio is controlled by the mixing ratio control mechanism 172 based on the computed mixing ratio, and the resist solution and the solvent are mixed in the resist and solvent mixing device 171.

The wafer W is then suction-held by the spin chuck 62 and rotated by the motor 63. Moreover, a mixed solution of the resist solution and the solvent of which the mixing ratio is controlled according to atmospheric pressure is applied to the upper face of the wafer W, and a resist film is formed. Thereafter, the resist film as a coating film is then subjected to exposure processing in the aligner 101 and developing processing in the developing unit, and a photo-resist pattern is formed.

As described above, the substrate processing system for the wafer W according to the seventh embodiment can control the thickness of a coating film in view of a change in the size of a photo-resist pattern due to a change in atmospheric pressure at the time of exposure. As a result, a photo-resist pattern with a stable size can be always obtained without being influenced by a change in atmospheric pressure.

Figure 21:
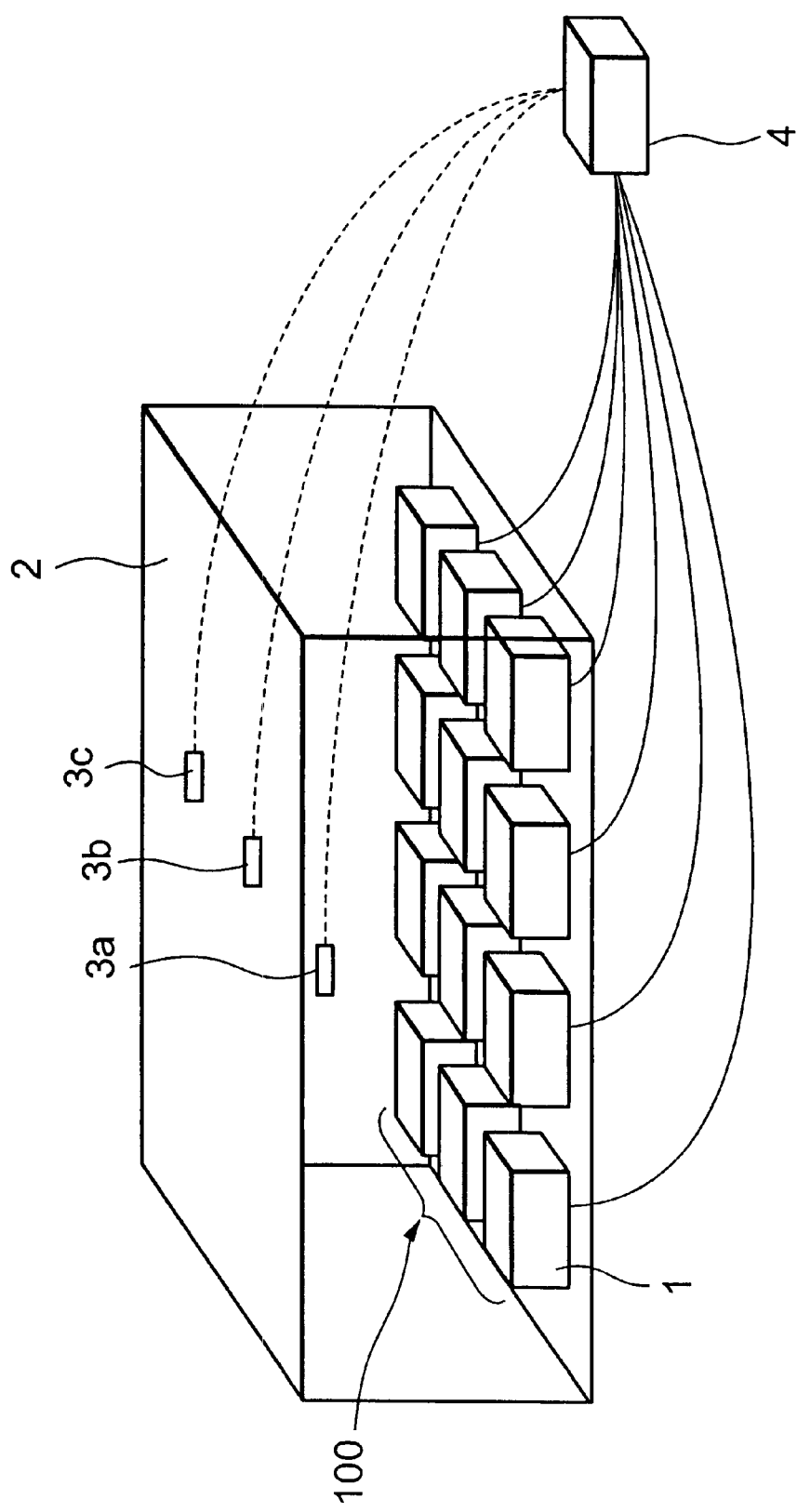
FIG. 21 is a schematic view of a substrate processing system according to an eighth embodiment.

Next, a substrate processing system according to an eighth embodiment will be explained by means of FIG. 21. In the aforesaid first embodiment, one barometer is provided in the FAB 2, but, for example, three barometers 3a to 3c may be provided as shown in FIG. 21. By providing three or more barometers as above, even if one barometer obtains a measured value different from a value measured by the other barometers, it can be judged that the one barometer is out of order, and data can be processed based on the measured value obtained by the other barometers, whereby the system capable of more reliable processing can be provided. In such a case, it is recommendable that measured values measured by the tree barometers 3a to 3c be sent to the host computer 4, and that the host computer 4 compare three measured values and judge a right atmospheric pressure value.

Although the embodiments explained above relate to a wafer processing system in a lithography process of the semiconductor wafer device fabrication process, the present invention can be applied to a processing system for substrates other than a semiconductor wafer, for example, an LCD substrate.

The aforesaid embodiments have the intention of clarifying technical meaning of the present invention. Therefore, the present invention is not intended to be limited to the above concrete embodiments and to be interpreted in a narrow sense, and various changes may be made therein without departing from the spirit of the present invention and within the meaning of the claims.

What is claimed is:

1. A substrate processing system, comprising:
    a first rotary coating apparatus, disposed in a room, for coating a substrate with a first chemical supplied from above the substrate while rotating the substrate;
    a second rotary coating apparatus, disposed in the room, for coating the substrate with a second chemical supplied from above the substrate while rotating the substrate;
    atmospheric pressure measuring means for measuring the atmospheric pressure in the room;
    controlling means for controlling rotation speed at the time of coating in said first rotary coating apparatus based on an atmospheric pressure value measured by said atmospheric pressure measuring means;
    temperature and humidity measuring means for measuring the temperature and humidity in said second rotary coating apparatus; and
    controlling means for controlling rotation speed at the time of coating in said second rotary coating apparatus based on a temperature value and a humidity value measured by said temperature and humidity measuring means.

2. The substrate processing system as set forth in claim 1, further comprising:
    mixing means for mixing a resist solution and a solvent to produce the chemical; and
    controlling means for controlling the mixing ratio of the resist solution to the solvent in said mixing means based on an atmospheric pressure value measured by said atmospheric pressure measuring means.

3. The system as set forth in claim 2, further comprising:
    a central control unit for sending the atmospheric pressure value measured by said atmospheric pressure measuring means to said controlling means for controlling the mixing ratio of the resist solution to the solvent in said mixing means,
    each of said controlling means controlling the mixing ratio individually based on the atmospheric pressure value.

4. A substrate processing system, comprising:
    a rotary coating apparatus for coating a substrate with a chemical supplied from above the substrate while rotating the substrate to form a coating film;
    an aligner for exposing the coating film;
    atmospheric pressure measuring means for measuring the atmospheric pressure in said aligner; and
    controlling means for controlling rotation speed at the time of coating in said rotary coating apparatus based on an atmospheric pressure value measured by said atmospheric pressure measuring means.

5. The substrate processing system as set forth in claim 4, further comprising:
    mixing means for mixing a resist solution and a solvent to produce the chemical; and
    controlling means for controlling the mixing ratio of the resist solution to the solvent in said mixing means based on an atmospheric pressure value measured by said atmospheric pressure measuring means.

6. A substrate processing system, comprising:
    a rotary coating apparatus, disposed in a room, for coating a substrate with a chemical supplied from above the substrate while rotating the substrate to form a coating film;
    an aligner, disposed in the room, for exposing the coating film;
    atmospheric pressure measuring means for measuring the atmospheric pressure in the room; and
    controlling means for controlling rotation speed at the time of coating in said rotary coating apparatus based on an atmospheric pressure value measured by said atmospheric pressure measuring means.

7. The substrate processing system as set forth in claim 6, further comprising:
    mixing means for mixing a resist solution and a solvent to produce the chemical; and
    controlling means for controlling the mixing ratio of the resist solution to the solvent in said mixing means based on an atmospheric pressure value measured by said atmospheric pressure measuring means.

8. The system as set forth in claim 7, further comprising:
    a central control unit for sending the atmospheric pressure value measured by said atmospheric pressure measuring means to said controlling means for controlling the mixing ratio of the resist solution to the solvent in said mixing means,
    each of said controlling means controlling the mixing ratio individually based on the atmospheric pressure value.

9. A substrate processing method, comprising the steps of:
    measuring the atmospheric pressure in an aligner for performing exposure processing for a substrate on which a coating film is formed;
    rotating the substrate while controlling rotation speed based on an atmospheric pressure value measured in said measuring step and coating the substrate with a chemical supplied from above the substrate to form the coating film; and
    subjecting the coating film to exposure processing in the aligner.

10. The substrate processing method as set forth in claim 9, wherein the measuring step is the measuring of the atmospheric pressure in a room where a rotary coating apparatus for coating a substrate with a chemical supplied from above the substrate while rotating the substrate is disposed; and further comprising the step of:
    controlling the mixing ratio of a resist solution to a solvent based on an atmospheric pressure value measure in said measuring step.

11. The method as set forth in claim 9, further comprising the step of:

subjecting the coating film to developing processing to form a photo-resist pattern after the exposure processing.

12. A substrate processing method, comprising the steps of:
   measuring the atmospheric pressure in an aligner for performing exposure processing for a substrate on which a coating film is formed;
   controlling the mixing ratio of a resist solution to a solvent based on an atmospheric pressure measured in said measuring step to produce a chemical;
   supplying the chemical onto the substrate and forming the coating film while rotating the substrate; and
   subjecting the coating film to exposure processing in the aligner.

13. The method as set forth in claim 12, further comprising the step of:
   subjecting the coating film to developing processing to form a photo-resist pattern after the exposure processing.

* * * * *